(12) United States Patent
Irobe

(10) Patent No.: US 12,185,573 B2
(45) Date of Patent: Dec. 31, 2024

(54) ELECTRO-OPTICAL DEVICE AND ELECTRONIC APPARATUS

(71) Applicant: SEIKO EPSON CORPORATION, Tokyo (JP)

(72) Inventor: Jun Irobe, Chino (JP)

(73) Assignee: SEIKO EPSON CORPORATION, Tokyo (JP)

( * ) Notice: Subject to any disclaimer, the term of this patent is extended or adjusted under 35 U.S.C. 154(b) by 434 days.

(21) Appl. No.: 17/528,131

(22) Filed: Nov. 16, 2021

(65) Prior Publication Data

US 2022/0158135 A1   May 19, 2022

(30) Foreign Application Priority Data

Nov. 18, 2020   (JP) .................................. 2020-191625

(51) Int. Cl.
*H10K 50/858* (2023.01)
*H01L 27/15* (2006.01)
*H01L 33/58* (2010.01)
*H10K 50/852* (2023.01)

(52) U.S. Cl.
CPC ......... *H10K 50/858* (2023.02); *H01L 27/156* (2013.01); *H01L 33/58* (2013.01); *H10K 50/852* (2023.02)

(58) Field of Classification Search
CPC .. H10K 50/858; H10K 50/852; H10K 50/844; H10K 59/38; H10K 59/353; H10K 59/123; H01L 27/156; H01L 33/58; H01L 25/0753; H01L 33/60
See application file for complete search history.

(56) References Cited

U.S. PATENT DOCUMENTS

| | | |
|---|---|---|
| 2009/0283786 A1 | 11/2009 | Kobayashi et al. |
| 2010/0014058 A1* | 1/2010 | Imai ..................... G02B 26/105 359/213.1 |
| 2011/0254437 A1 | 10/2011 | Yamada et al. |
| 2012/0104367 A1 | 5/2012 | Hasegawa et al. |

(Continued)

FOREIGN PATENT DOCUMENTS

| | | |
|---|---|---|
| JP | 2000193928 | 7/2000 |
| JP | 2002148617 | 5/2002 |

(Continued)

*Primary Examiner* — Yasser A Abdelaziz
(74) *Attorney, Agent, or Firm* — JCIPRNET

(57) ABSTRACT

An electro-optical device includes: a first light emitting element including an electrode and a first reflective layer disposed apart from the electrode by a first optical distance, a second light emitting element including the electrode and a second reflective layer disposed apart from the electrode by a second optical distance, a first microlens configured such that light emitted from the first light emitting element is incident on the first microlens, and a second microlens configured such that light emitted from the second light emitting element is incident on the second microlens, wherein a full width at half maximum of a spectrum of a first color light corresponding to the first optical distance is different from a full width at half maximum of a spectrum of a second color light corresponding to the second optical distance, and a curvature of the first microlens is smaller than a curvature of the second microlens.

5 Claims, 17 Drawing Sheets

(56) References Cited

U.S. PATENT DOCUMENTS

| | | | | |
|---|---|---|---|---|
| 2012/0104368 A1* | 5/2012 | Isobe | .................. | H10K 59/879 |
| | | | | 257/40 |
| 2012/0133575 A1 | 5/2012 | Hasegawa | | |
| 2017/0176812 A1* | 6/2017 | Ozawa | ................ | G02B 3/0012 |
| 2018/0143490 A1* | 5/2018 | Wakabayashi | ....... | G02B 3/0056 |
| 2020/0358034 A1* | 11/2020 | Koshihara | ............ | H10K 50/858 |
| 2022/0006057 A1 | 1/2022 | Itonaga | | |

FOREIGN PATENT DOCUMENTS

| | | |
|---|---|---|
| JP | 2009277507 | 11/2009 |
| JP | 2010034074 | 2/2010 |
| JP | 2012109213 | 6/2012 |
| JP | 2012109214 | 6/2012 |
| JP | 2012134128 | 7/2012 |
| JP | 2017157330 | 9/2017 |
| WO | 2020110665 | 6/2020 |

\* cited by examiner

ELECTRO-OPTICAL DEVICE AND ELECTRONIC APPARATUS

The present application is based on, and claims priority from JP Application Serial Number 2020-191625, filed Nov. 18, 2020, the disclosure of which is hereby incorporated by reference herein in its entirety.

BACKGROUND

1. Technical Field

The present disclosure relates to an electro-optical device and an electronic apparatus.

2. Related Art

There has been known an electro-optical device such as a display device having a light emitting element such as an organic electroluminescence (EL) element.

A display device disclosed in JP-A-2012-134128 includes a plurality of light emitting elements and a plurality of microlenses. The microlenses are formed individually for respective light emitting elements. Each microlens changes a direction of light emitted from the corresponding light emitting element. Further, all microlenses disclosed in JP-A-2012-134128 are formed to have the same curvature.

As in the case of JP-A-2012-134128, it is thought that a light extraction efficiency can be increased by using the microlenses that condense light. Further, for example, it is thought that a visual field angle characteristic can be increased by using a microlens that diverges light.

A full width at half maximum of light emitted from the light emitting element varies for each color. Further, when the light emitted from the light emitting element is resonated by an optical resonance structure, for example, a light distribution characteristic of the light differs for each color. Accordingly, when microlenses having the same curvature are used for all light emitting elements without taking into account the full width at half maximum of the light, there is a concern that the function of the microlenses may not be sufficiently exerted. As a result, even when the microlenses are used, it is difficult to sufficiently enhance the light extraction efficiency or the visual field angle characteristic.

SUMMARY

An electro-optical device according to an aspect of the present disclosure includes: a first light emitting element including an electrode and a first reflective layer disposed apart from the electrode by a first optical distance, a second light emitting element including the electrode and a second reflective layer disposed apart from the electrode by a second optical distance, a first microlens configured such that light emitted from the first light emitting element is incident on the first microlens, and a second microlens configured such that light emitted from the second light emitting element is incident on the second microlens, wherein a full width at half maximum of a spectrum of a first color light corresponding to the first optical distance is different from a full width at half maximum of a spectrum of a second color light corresponding to the second optical distance, and a curvature of the first microlens is smaller than a curvature of the second microlens.

An electronic apparatus according to an aspect of the present disclosure includes: a first panel having a first light emitting element including a first electrode and a first reflective layer disposed apart from the first electrode by a first optical distance, and a first microlens configured such that light emitted from the first light emitting element is incident on the first microlens, a second panel having a second light emitting element including a second electrode and a second reflective layer disposed apart from the second electrode by a second optical distance, and a second microlens configured such that light emitted from the second light emitting element is incident on the second microlens, a third panel having a third light emitting element including a third electrode and a third reflective layer disposed apart from the third electrode by a third optical distance, and a third microlens configured such that light emitted from the third light emitting element is incident on the third microlens, and a color synthesizing prism that synthesizes light emitted from the first panel, the second panel, and the third panel, wherein a full width at half maximum of a spectrum of a first color light corresponding to the first optical distance is different from a full width at half maximum of a spectrum of a second color light corresponding to the second optical distance and a full width at half maximum of a spectrum of a third color light corresponding to the third optical distance, and a curvature of the first microlens is smaller than a curvature of the second microlens and a curvature of the third microlens.

The electronic apparatus according to an aspect of the present disclosure includes the above-described electro-optical device and a control unit configured to control an operation of the electro-optical device.

DESCRIPTION OF EXEMPLARY EMBODIMENTS

Figure 1:
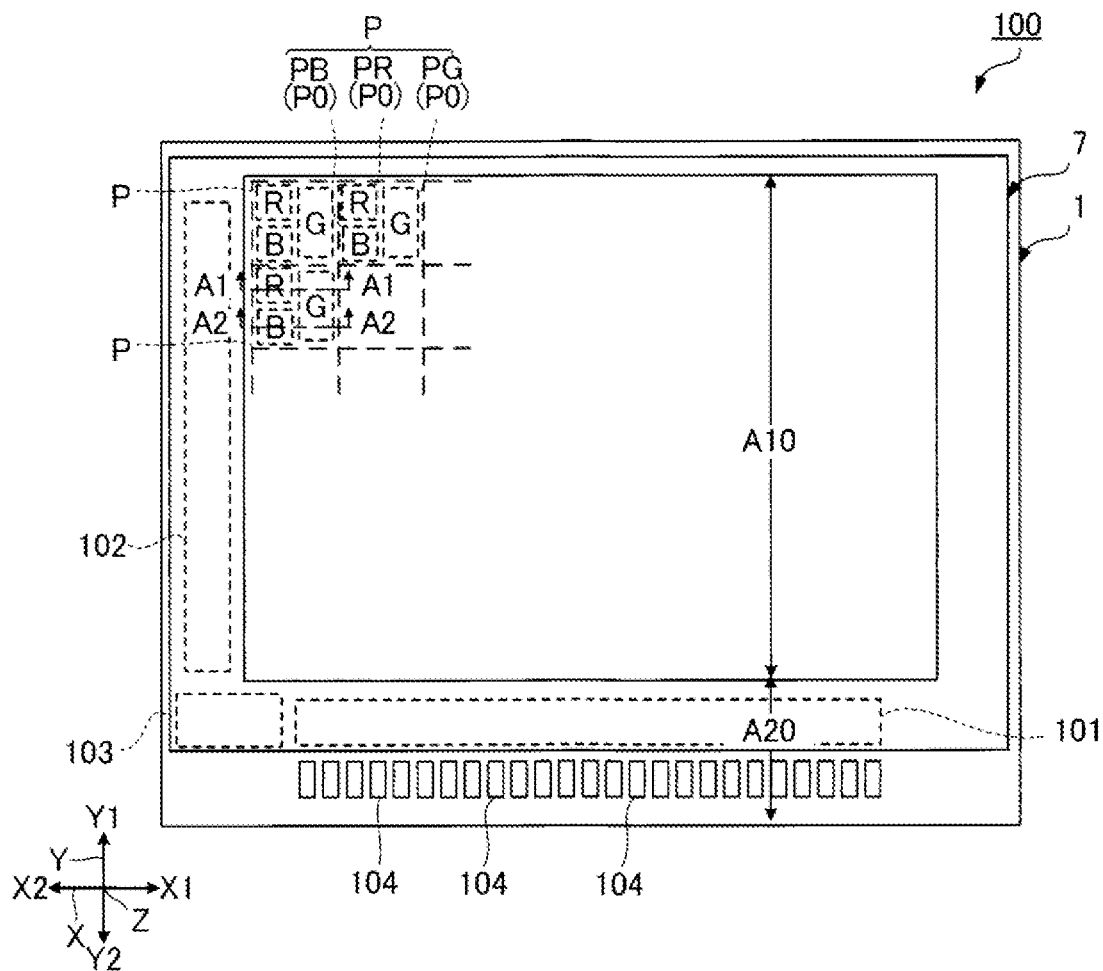
FIG. 1 is a plan view schematically illustrating an electro-optical device according to a first embodiment.

Hereinafter, preferred embodiments according to the present disclosure are described with reference to attached drawings. Here, in the drawings, dimensions and scales of respective parts are different from actual dimensions and scales when appropriate, and some of the parts are schematically illustrated for ease of understanding. Further, the scope of the present disclosure is not limited to these configurations unless otherwise the scope of the present disclosure is specifically limited by the description made hereinafter.

1. Electro-Optical Device 100

1A. First Embodiment

1A-1. Overall Configuration of Electro-Optical Device 100

FIG. 1 is a plan view schematically illustrating the electro-optical device 100 according to the first embodiment. Hereinafter, for the sake of convenience of the description, the description is made by using an X axis, a Y axis, and a Z axis orthogonal to each other when appropriate. A direction along the X axis is assumed as an X1 direction, and a direction opposite to the X1 direction is assumed as an X2 direction. In the same manner, a direction along the Y axis is assumed as a Y1 direction, and a direction opposite to the Y1 direction is assumed as a Y2 direction. A direction along the Z axis is assumed as a Z1 direction, and a direction opposite to the Z1 direction is assumed as a Z2 direction. Viewing the electro-optical device 100 from the Z1 direction or the Z2 direction is referred to as "as viewed in plan view".

The electro-optical device 100 illustrated in FIG. 1 is a device configured to display a full color image thereon by making use of an organic electroluminescence (EL). Here, the image includes an image that displays only character information. The electro-optical device 100 is a micro display preferably used for a head-mounted display and the like, for example.

The electro-optical device 100 includes a display region A10 for displaying an image, and a peripheral region A20 surrounding a periphery of the display region A10 as viewed in plan view. In the display region A10, a plurality of pixels P are disposed. Each pixel P is a minimum unit in the display of an image. In an example illustrated in the drawings, the plurality of pixels P are arranged in a matrix array in the X1 direction and the Y2 direction. Each pixel P has a sub pixel PR from which light of a red wavelength region can be obtained, a sub pixel PB from which light of a blue wavelength region can be obtained, and a sub pixel PG from which light of a green wavelength region can be obtained. One pixel P among pixels forming a color image is constituted of the sub pixel PB, the sub pixel PG, and the sub pixel PR. The blue wavelength region is a wavelength region shorter than the green wavelength region, and the green wavelength region is a wavelength region shorter than the red wavelength region. The red wavelength region is more than 580 nm and equal to or less than 700 nm. The green wavelength region is equal to or more than 500 nm and equal to or less than 580 nm. The blue wavelength region is equal to or more than 400 nm and less than 500 nm.

In the present embodiment, the light of the blue wavelength region is the "first color light". Either one of the light of the red wavelength region or the light of the green wavelength region is the "second color light", and the other is the "third color light".

Hereinafter, when the sub pixel PB, the sub pixel PG, and the sub pixel PR are not differentiated from each other, these sub pixels PB, PG, PR are each expressed as a sub pixel P0. The sub pixel P0 is an element constituting the pixel P. The sub pixel P0 is an independently controlled minimum unit. In the present embodiment, the sub pixels P0 are arranged in a rectangle array. In the present embodiment, among three sub pixels P0 that the pixel P includes, the sub pixel PG has the largest area. However, the sub pixel PB or the sub pixel PR may have the largest area.

The electro-optical device 100 includes an element substrate 1, and a transmissive substrate 7 having a light transmissivity. The electro-optical device 100 has a so-called top-emitting structure, and the electro-optical device 100 emits light through the transmissive substrate 7. Then, the "light transmissivity" means transmissivity with respect to visible light and, further, it is preferable that the light transmissivity mean that a transmittance of the visible light is equal to or more than 50%.

The element substrate 1 includes a data line drive circuit 101, a scanning line drive circuit 102, a control circuit 103, and a plurality of external terminals 104. The data line drive circuit 101, the scanning line drive circuit 102, the control circuit 103, and the plurality of external terminals 104 are disposed in the peripheral region A20. The data line drive circuit 101 and the scanning line drive circuit 102 are peripheral circuits for controlling driving of the respective parts constituting the plurality of sub pixels P0. The control circuit 103 is configured to control display of an image. To the control circuit 103, image data is supplied from a higher circuit not illustrated in the drawing. The control circuit 103 is configured to supply various signals based on the image data to the data line drive circuit 101 and the scanning line drive circuit 102. Although not illustrated in the drawings, to the external terminals 104, a flexible printed circuit (FPC) board or the like is coupled for obtaining electrical connection with the higher circuit. Further, to the element substrate 1, a power source circuit not illustrated in the drawings is electrically coupled.

The transmissive substrate 7 is a counter substrate that protects a light emitting portion 2 and a color filter 5 described below included in the element substrate 1. The transmissive substrate 7 is constituted of a glass substrate or a quartz substrate, for example.

Figure 2:
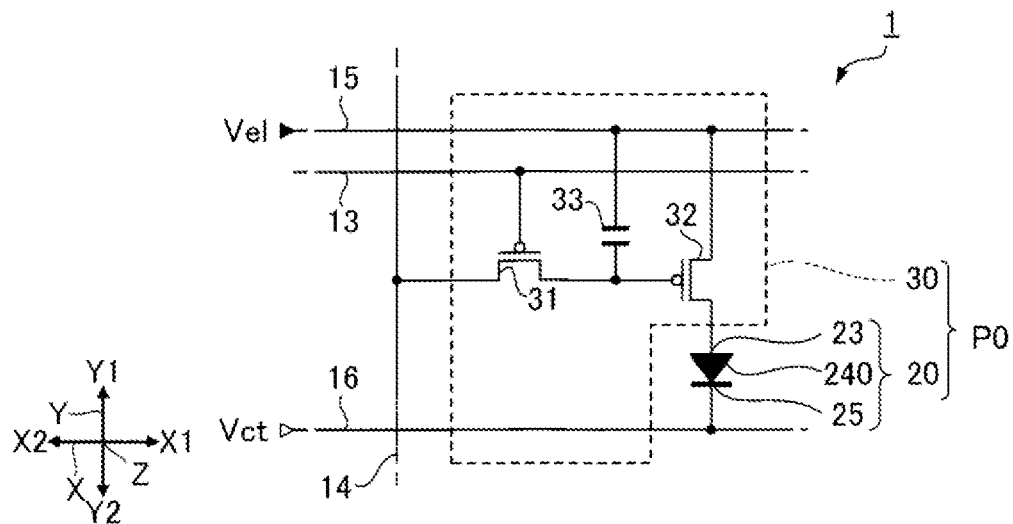
FIG. 2 is an equivalent circuit diagram of a sub pixel illustrated in FIG. 1.

FIG. 2 is an equivalent circuit diagram of the sub pixel P0 illustrated in FIG. 1. The element substrate 1 is provided with a plurality of scanning lines 13, a plurality of data lines 14, a plurality of power supply lines 15, and a plurality of power supply lines 16. In FIG. 2, one sub pixel P0 and elements corresponding to the sub pixel P0 are representatively illustrated.

The scanning lines 13 extend in the X1 direction, and the data lines 14 extend in the Y1 direction. Although not illustrated, the plurality of scanning lines 13 and the plurality of data lines 14 are arranged in a lattice shape. The scanning lines 13 are coupled to the scanning line drive circuit 102 illustrated in FIG. 1, and the data lines 14 are coupled to the data line drive circuit 101 illustrated in FIG. 1.

As illustrated in FIG. 2, the sub pixel P0 is provided with a light emitting element 20, and a pixel circuit 30 configured to control driving of the light emitting element 20. The light emitting element 20 is an organic light emitting diode (OLED). The light emitting element 20 includes a pixel electrode 23, a common electrode 25, and a light emitting layer 240. The common electrode 25 is an example of an "electrode".

To the pixel electrode 23, the power supply line 15 is electrically coupled via the pixel circuit 30. On the other hand, to the common electrode 25, the power supply line 16 is electrically coupled. Here, to the power supply line 15, a power source potential Vel on a high potential side is supplied from a power source circuit not illustrated in the drawing. To the power supply line 16, a power source potential Vct on a low potential side is supplied from the power source circuit not illustrated in the drawing. The pixel electrode 23 functions as an anode, and the common electrode 25 functions as a cathode. In the light emitting element 20, the light emitting layer 240 emits light by recombining holes supplied from the pixel electrode 23 and electrons supplied from the common electrode 25 with each other at the light emitting layer 240. Here, the pixel electrode 23 is provided for each sub pixel P0, and the pixel electrode 23 is controlled independently from other pixel electrodes 23.

The pixel circuit 30 includes a switching transistor 31, a driving transistor 32, and a retention capacitor 33. A gate of the switching transistor 31 is electrically coupled to the scanning line 13. Further, one of a source and a drain of the switching transistor 31 is electrically coupled to the data line 14, and the other is electrically coupled to a gate of the driving transistor 32. Further, one of a source and a drain of the driving transistor 32 is electrically coupled to the power supply line 15, and the other is electrically coupled to the pixel electrode 23. Further, one of electrodes of the retention capacitor 33 is coupled to the gate of the driving transistor 32, and the other electrode is coupled to the power supply line 15.

In the pixel circuit 30, when the scanning line drive circuit 102 activates a scanning signal and the scanning line 13 is selected, the switching transistor 31 provided in the selected sub pixel P0 is turned on. Then, a data signal is supplied from the data line 14 to the driving transistor 32 corresponding to the selected scanning line 13. The driving transistor 32 supplies a current corresponding to a potential of the supplied data signal, that is, a current corresponding to a potential difference between the gate and the source to the light emitting element 20. Further, the light emitting element 20 emits light at brightness corresponding to a magnitude of the current supplied from the driving transistor 32. When the scanning line drive circuit 102 releases the selection of the scanning line 13 and the switching transistor 31 is turned off, a potential of the gate of the driving transistor 32 is held by the retention capacitor 33. Accordingly, the light emitting element 20 can maintain emitting of light even after the switching transistor 31 is turned off.

The configuration of the pixel circuit 30 described above is not limited to the configuration illustrated in the drawing. For example, the pixel circuit 30 may further include a transistor for controlling the conduction between the pixel electrode 23 and the driving transistor 32.

1A-2. Element Substrate 1

Figure 3:
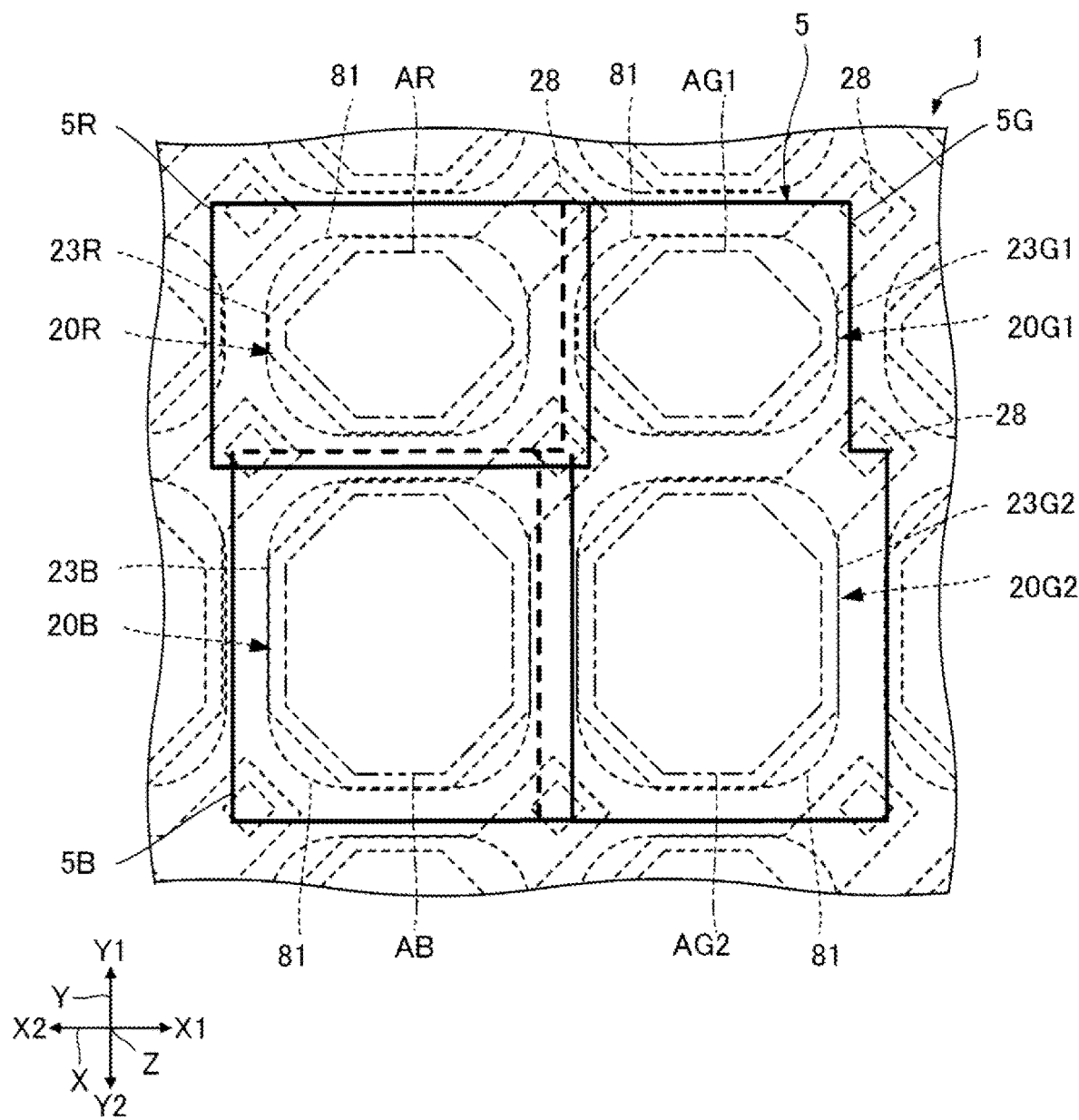
FIG. 3 is a plan view illustrating a part of an element substrate.

FIG. 3 is a plan view illustrating a portion of the element substrate 1 illustrated in FIG. 1. In FIG. 3, elements of one pixel P are illustrated representatively. Hereinafter, "R" is affixed to the end of a symbol indicating the element relating to the sub pixel PR, "G" is affixed to the end of a symbol indicating the element relating to the sub pixel PG, and "B" is affixed to the end of a symbol indicating the element relating to the sub pixel PB. When it is unnecessary to differentiate the elements by respective display colors, "B", "G", and "R" at the ends of the symbols are omitted.

As illustrated in FIG. 3, the element substrate 1 has a set of light emitting elements 20R, 20B, 20G1, and 20G2 for each pixel P. The light emitting element 20R is the light emitting element 20 provided in the sub pixel PR. The light emitting element 20B is the light emitting element 20 provided in the sub pixel PB. Each of the light emitting elements 20G1 and 20G2 is the light emitting element 20 provided in the sub pixel PG. The light emitting elements 20G1 and 20G2 share one pixel circuit 30 for each sub pixel PG. Accordingly, the light emitting elements 20G1 and 20G2 may be collectively regarded as one light emitting element 20G.

In the present embodiment, the light emitting element 20B of the sub pixel PB is a "first light emitting element". Either one of the light emitting element 20R of the sub pixel PR or the light emitting element 20G1 of the sub pixel PG is a "second light emitting element", and the other is a "third light emitting element". Here, instead of the light emitting element 20G1, the light emitting element 20G2 may be the "second light emitting element" or the "third light emitting element".

The light emitting element 20R has a light emitting region AR where light of a wavelength region including a red wavelength region is emitted. The light emitting element 20B has a light emitting region AB where light of a wavelength region including a blue wavelength region is emitted. The light emitting element 20G1 has a light emitting region AG1 where light of a wavelength region including a green wavelength region is emitted. The light emitting element 20G2 has a light emitting region AG2 where light of a wavelength region including a green wavelength region is emitted.

In the example illustrated in FIG. 3, the light emitting regions AR, AG1, AG2, and AB each have an octagonal shape as viewed in plan view. Areas of the light emitting regions AR and AB as viewed in plan view are each smaller than the sum of areas of the light emitting regions AG1 and AG2 as viewed in a plan view. The shapes of the light emitting regions AR, AG1, AG2, and AB as viewed in plan view may differ from each other or may be equal to each other.

Figure 4:
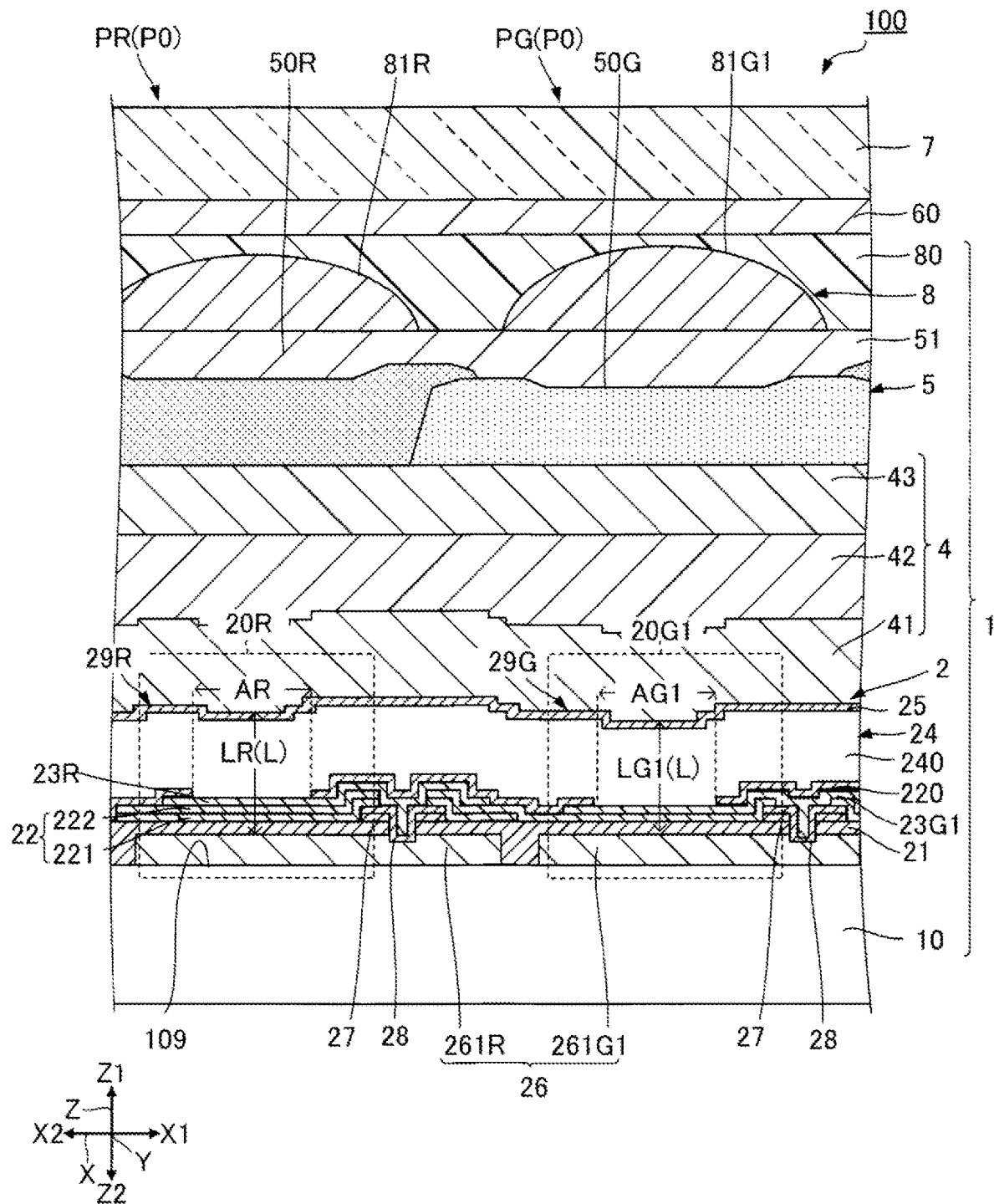
FIG. 4 is a cross-sectional view of the electro-optical device illustrated in FIG. 1.
Figure 5:
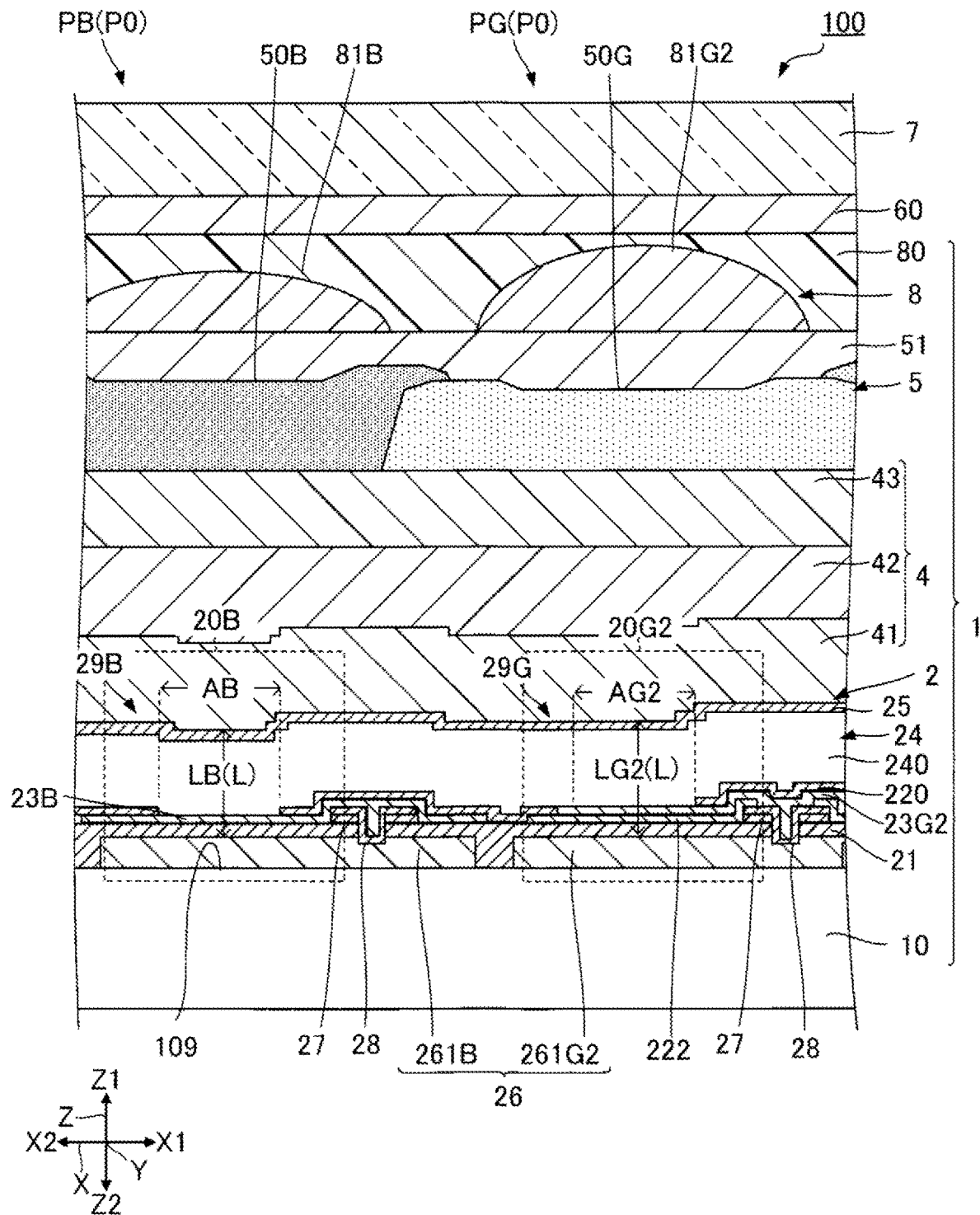
FIG. 5 is a cross-sectional view of the electro-optical device illustrated in FIG. 1.

FIG. 4 and FIG. 5 are cross-sectional views of the electro-optical device 100 illustrated in FIG. 1. FIG. 4 corresponds to a cross section of the sub pixels PR and PG, and FIG. 5 corresponds to a cross section of the sub pixels PB and PG. That is, FIG. 4 corresponds to a cross section taken along a line A1-A1 in FIG. 1, and FIG. 5 corresponds to a cross section taken along a line A2-A2 in FIG. 1.

As illustrated in FIG. 4 and FIG. 5, the element substrate 1 includes a substrate 10, a light emitting portion 2, a sealing layer 4, the color filter 5, an insulating layer 51, a lens portion 8, and a cover layer 80. These constitutional elements are stacked in this order in the Z1 direction. The light emitting portion 2 includes the plurality of light emitting elements 20 described above. The transmissive substrate 7 is bonded to the element substrate 1 by a filler 60 having a function as an adhesive agent. Since the element substrate 1 has the lens portion 8, the light extraction efficiency can be increased. Hereinafter, respective constitutional elements that the element substrate 1 includes are described.

Although not illustrated in detail in the drawings, the substrate 10 is a wiring substrate where the pixel circuits 30 described above are formed on a silicon substrate, for example. Here, instead of the silicon substrate, a glass substrate, a resin substrate, or a ceramic substrate may be used, for example. Further, although not illustrated in detail in the drawings, each of the above-mentioned transistors that the pixel circuit 30 includes may be any one of a MOS transistor, a thin film transistor, or a field effect transistor. When the transistor that the pixel circuit 30 includes is a MOS transistor having an active layer, the active layer may be constituted of a silicon substrate. As a material for forming respective elements and various wirings that the pixel circuit 30 includes, a conductive material such as a polysilicon, metal, a metal silicide, a metallic compound, and the like can be named, for example.

The light emitting portion 2 is disposed on the substrate 10. The light emitting portion 2 includes a reflective portion 26, an insulating layer 21, a light transmitting layer 22, an element separation layer 220, a plurality of pixel electrodes 23, an organic layer 24, and a common electrode 25 serving as an "electrode". The plurality of pixel electrodes 23 are light transmitting layers, and the common electrode 25 is a semi-transmissive reflective layer. The light emitting portion 2 forms the above-mentioned plurality of light emitting elements 20 by these elements. Further, the organic layer 24 has the above-mentioned light emitting layer 240.

The reflective portion 26 is disposed between the substrate 10 and the common electrode 25. The reflective portion 26 includes a plurality of reflective layers 261 each having light reflectivity. Each reflective layer 261 reflects light emitted by the light emitting layer 240. The "light reflectivity" means a reflectivity with respect to visible light and, further, it is preferable that the light reflectivity mean that a reflectance of the visible light is equal to or more than 50%. Although not illustrated in the drawing, the plurality of reflective layers 261 are provided for each light emitting element 20.

In the present embodiment, the reflective layer 261B that the light emitting element 20B includes is a "first reflective layer". Either one of the reflective layer 261R that the light emitting element 20R includes or the reflective layer 261G1 that the light emitting element 20G1 includes is a "second reflective layer", and the other is a "third reflective layer". Here, instead of the reflective layer 261G that the light emitting element 20G1 includes, a reflective layer 261G2 that the light emitting element 20G2 includes may be the "second reflective layer" or the "third reflective layer".

As a material for forming the reflective portion 26, metal such as aluminum (AL), copper (Cu), silver (Ag), and the like, or an alloy of these metals can be named, for example. Here, the reflective portion 26 may have a function as a wiring electrically coupled to the pixel circuit 30. Further, although not illustrated in the drawings, a reflection enhancing film having a light transmissivity and an insulating property for enhancing light reflectivity of the reflective portion 26 may be disposed between the reflective portion 26 and the insulating layer 21. The reflection enhancing film is a silicon oxide film, for example.

The insulating layer 21 is disposed on the reflective portion 26 and fills gaps between the plurality of reflective layers 261 that the reflective portion 26 includes. The insulating layer 21 is formed of a silicon nitride (SiN) film, for example. Here, although not illustrated in detail in the drawings, the insulating layer 21 is a stacked body of a plurality of layers, for example.

A plurality of contact electrodes 28 are disposed on the insulating layer 21. The contact electrode 28 is provided for each light emitting element 20. The contact electrode 28 electrically couples the pixel circuit 30 and the pixel electrode 23 to each other. Here, an insulating portion 27 formed of an insulating material such as a silicon oxide is provided between the contact electrode 28 and the insulating layer 21. A material for forming the contact electrode 28 is a conductive material such as tungsten (W), titanium (Ti), titanium nitride (TiN), or the like, for example.

The light transmitting layer 22 is disposed on the insulating layer 21. The light transmitting layer 22 is formed of a plurality of films having an insulating property. To be more specific, the light transmitting layer 22 includes a first insulating film 221 and a second insulating film 222. The first insulating film 221 is disposed in the sub pixel PR and is not disposed in the sub pixels PB and PG. The second insulating film 222 is disposed on the first insulating film 221. The second insulating film 222 is disposed in the sub pixels PR and PG, and is not disposed in the sub pixel PB. As a material for forming the light transmitting layer 22, a silicon-based inorganic material such as a silicon oxide, a silicon nitride, or the like can be named, for example.

The plurality of pixel electrodes 23 are disposed on the light transmitting layer 22. The pixel electrode 23 is provided for each light emitting element 20. Although not illustrated in the drawing, each pixel electrode 23 overlaps with the corresponding reflective layer 261 as viewed in plan view. Each pixel electrode 23 is a transparent electrode having a light transmissivity and conductivity. As a material for forming the pixel electrode 23, a transparent conductive material such as an indium tin oxide (ITO), an indium zinc oxide (IZO), or the like can be named. Here, the pixel electrode 23R is a pixel electrode 23 provided in the sub pixel PR. The pixel electrode 23B is a pixel electrode 23 provided in the sub pixel PB. The pixel electrodes 23G1 and 23G2 are pixel electrodes 23 provided in the sub pixel PG. Here, the pixel electrodes 23G1 and 23G2 may be formed in a separated manner or may be formed as an integral body.

The element separation layer 220 having a plurality of openings is disposed on the light transmitting layer 22. The element separation layer 220 covers respective outer edges of the plurality of pixel electrodes 23. Due to the provision of the element separation layer 220, the plurality of pixel electrodes 23 are electrically insulated from each other. Due to the plurality of openings that the element separation layer 220 includes, a plurality of light emitting regions A are defined. Further, the light emitting region A can be defined as a region where the organic layer 24 and the pixel electrode 23 are brought into contact with each other. As a material for forming the element separation layer 220, a silicon-based inorganic material such as a silicon oxide, a silicon nitride, or the like can be named, for example.

The organic layer 24 is disposed on the plurality of pixel electrodes 23. The organic layer 24 is shared in common by the plurality of light emitting elements 20. The organic layer 24 is disposed between the reflective portion 26 and the common electrode 25. The organic layer 24 includes the light emitting layer 240 containing an organic light emitting material. The organic light emitting material is a light emitting organic compound. Further, the organic layer 24 includes a hole injection layer, a hole transport layer, an electron transport layer, an electron injection layer, and the like, for example, besides the light emitting layer 240. The organic layer 24 includes the light emitting layer 240 where light emission colors of blue, green, and red can be obtained thus realizing emission of white light. Here, the configuration of the organic layer 24 is not particularly limited to the above-mentioned configuration, and a known configuration is applicable as the organic layer 24.

The common electrode 25 is disposed on the organic layer 24. The common electrode 25 is shared by the plurality of light emitting elements 20. The common electrode 25 is disposed between the light emitting layer 240 and the color filter 5. The common electrode 25 has light reflectivity and light transmissivity. Further, the common electrode 25 has a conductivity. The common electrode 25 is formed of an alloy including Ag such as MgAg, for example.

In the light emitting portion 2 described above, the light emitting element 20R includes the reflective layer 261R, the insulating layer 21, the first insulating film 221, the second insulating film 222, the element separation layer 220, the pixel electrode 23R, the organic layer 24, and the common electrode 25. The light emitting element 20G1 includes the reflective layer 261G1, the insulating layer 21, the second insulating film 222, the element separation layer 220, the pixel electrode 23G1, the organic layer 24, and the common electrode 25. The light emitting element 20G2 includes the reflective layer 261G2, the insulating layer 21, the second insulating film 222, the element separation layer 220, the pixel electrode 23G2, the organic layer 24, and the common electrode 25. The light emitting element 20B includes the reflective layer 261B, the insulating layer 21, the element separation layer 220, the pixel electrode 23B, the organic layer 24, and the common electrode 25.

Further, each light emitting element 20 has an optical resonance structure 29 that resonates light of a predetermined wavelength region between the reflective portion 26 and the common electrode 25. The optical resonance structure 29 is described later.

The sealing layer 4 is disposed on the plurality of light emitting elements 20. The sealing layer 4 protects the plurality of light emitting elements 20. To be more specific, the sealing layer 4 is a sealing layer that seals the plurality of light emitting elements 20 so as to protect the plurality of light emitting elements 20 from outside. The sealing layer 4 has a gas barrier property, and the sealing layer 4 protects each light emitting element 20 from external moisture, oxygen, or the like, for example. By providing the sealing layer 4, degradation of the light emitting element 20 can be suppressed as compared to a case where the sealing layer 4 is not provided. Accordingly, the quality reliability of the electro-optical device 100 can be enhanced. Further, the sealing layer 4 has a light transmissivity.

The sealing layer 4 includes a first sealing layer 41, a second sealing layer 42, and a third sealing layer 43. The first sealing layer 41, the second sealing layer 42, and the third sealing layer 43 are stacked in this order in a direction away from the substrate 10. The first sealing layer 41, the second sealing layer 42, and the third sealing layer 43 each have light transmissivity and an insulating property. A material for forming each of the first sealing layer 41 and the third sealing layer 43 is an inorganic material such as a silicon oxynitride (SiON) or the like, for example. The second sealing layer 42 is a leveled layer for providing a flat surface to the third sealing layer 43. A material for forming the second sealing layer 42 is a resin such as an epoxy resin, or an inorganic material such as an aluminum oxide ($Al_2O_3$), or the like, for example. Here, the sealing layer 4 has three layers, but may have one, two, or four or more layers.

The color filter 5 is disposed on the sealing layer 4. The color filter 5 allows light of a predetermined wavelength region to selectively pass therethrough. The predetermined wavelength region includes a peak wavelength λ0 for each color. By providing the color filter 5, color purity of light emitted from each sub pixel P0 can be enhanced as compared to a case where the color filter 5 is not provided. The color filter 5 is formed of a resin material such as an acrylic photosensitive resin material containing a color material, for example. The color material is a pigment or a dye.

The color filter 5 includes a colored layer 50R provided corresponding to the sub pixel PR, a colored layer 50B provided corresponding to the sub pixel PB, and a colored layer 50G provided corresponding to the sub pixel PG. The colored layer 50 is provided for each sub pixel P0. The colored layer 50R allows light of a red wavelength region, among the light from the light emitting element 20R, to selectively pass therethrough. The colored layer 50B allows light of a blue wavelength region, among the light from the light emitting element 20B, to selectively pass therethrough. The colored layer 50G allows light of a green wavelength region, among the light from the light emitting elements 20G1 and 20G2, to selectively pass therethrough. Here, the colored layers 50R, 50G, and 50B have portions that overlap each other as viewed in plan view. However, the colored layers 50R, 50G, and 50B may not overlap each other.

The insulating layer 51 is disposed on the color filter 5. The insulating layer 51 has a light transmissivity and an insulating property. The insulating layer 51 is provided for leveling unevenness of an upper surface of the color filter 5. A material for forming the insulating layer 51 is a resin material, or an inorganic material such as a silicon oxide, or the like, for example. Here, the insulating layer 51 may be omitted.

The lens portion 8 is disposed on the insulating layer 51. The lens portion 8 is a microlens array including a plurality of microlenses 81. Here, the lens portion 8 is described in detail later.

A cover layer 80 is disposed on the lens portion 8. The cover layer 80 protects the lens portion 8. The cover layer 80 has a light transmissivity and an insulating property. The cover layer 80 is formed using a resin material such as an epoxy resin, an acrylic resin, or the like, for example. Here, an inorganic material layer formed of an inorganic material having a light transmissivity and an insulating property may be disposed between the cover layer 80 and the lens portion 8. In this case, the inorganic material layer protects the lens portion 8. The filler 60 is disposed on the cover layer 80. The filler 60 has a function of bonding the element substrate 1 and the transmissive substrate 7 to each other. The filler 60 is formed of an epoxy-based adhesive agent or an acrylic-based adhesive agent, for example.

1A-3. Optical Resonance Structure 29

As described above, each light emitting element 20 has the optical resonance structure 29 that resonates light of a predetermined wavelength region between the reflective portion 26 and the common electrode 25. The optical resonance structure 29 allows light emitted by the light emitting layer 240 that the organic layer 24 includes to be multiply reflected between the reflective portion 26 and the common electrode 25, and selectively increases intensity of light of a predetermined wavelength region.

In the present embodiment, the light emitting elements 20R, 20G, and 20B have the different optical resonance structures 29 respectively. The light emitting element 20R has an optical resonance structure 29R that increases intensity of light of the red wavelength region between the reflective layer 261R and the common electrode 25. The light emitting element 20G1 has an optical resonance structure 29G that increases intensity of light of the green wavelength region between the reflective layer 261G1 and the common electrode 25. The light emitting element 20G2 has an optical resonance structure 29G that increases intensity of light of the green wavelength region between the reflective layer 261G2 and the common electrode 25. The light emitting element 20B has an optical resonance structure 29B that increases intensity of light of the blue wavelength region between the reflective layer 261B and the common electrode 25. Accordingly, intensity of light of a desired wavelength region can be increased for each sub pixel P0 due to an optical resonance effect, and such light can be emitted to the outside.

A resonance wavelength in the optical resonance structure 29 is determined based on an optical distance L between the reflective portion 26 and the common electrode 25. Each reflective layer 261 is disposed in a spaced apart manner from the common electrode 25 by the optical distance L. The optical distance L is obtained by the product of a distance between a surface of the reflective portion 26 on a side opposite to the substrate 10 and a surface of the common electrode 25 on a sealing layer 4 side and a refractive index between the reflective portion 26 and the common electrode 25.

To be more specific, assuming the resonant wavelength as λ0, the following relational expression [1] is established. In the relational expression [1], symbol Φ (radian) indicates the sum of phase shifts generated during transmission and reflection of lights between the reflective layer 261 and the common electrode 25.

$$\{(2 \times L)/\lambda 0 + \Phi\}/(2\pi) = m0 \ (m0 \text{ being an integer}) \quad [1]$$

The optical distance L is set such that a peak wavelength of light of a wavelength region to be extracted becomes a wavelength λ0. Due to such setting of the optical distance L, intensity of light of a predetermined wavelength region to be extracted is increased and hence, the increase of intensity of the light and the narrowing of a spectrum of the light can be achieved.

In the present embodiment, the optical distance L is controlled for each color. Accordingly, the optical distance L is different for each sub pixel P0. Accordingly, symbol λ in the (relational expression 1) is different for each color. To be more specific, an optical distance LR in the sub pixel PR is set corresponding to the red wavelength region. An optical distance LG1 in the sub pixel PG is set corresponding to the green wavelength region. An optical distance LG2 in the sub pixel PG is set corresponding to the green wavelength region. An optical distance LB in the sub pixel PB is set corresponding to the blue wavelength region.

In the present embodiment, the optical distance LB in the sub pixel PB is a "first optical distance". Either one of the optical distance LR in the sub pixel PR or the optical distance LG1 in the sub pixel PG is a "second optical distance", and the other is a "third optical distance". Here, instead of the optical distance LG1, the optical distance LG2 may be the "second optical distance" or the "third optical distance".

In the present embodiment, by making a thickness of the light transmitting layer 22 different for each color, the optical distance L is adjusted. To be more specific, with respect to the thickness of the light transmitting layer 22, the thickness of the light transmitting layer 22 in the sub pixel PR, the thickness of the light transmitting layer 22 in the sub pixel PG, and the thickness of the light transmitting layer 22 in the sub pixel PB become larger in this order. A method for adjusting the optical distance L is not limited to the method for adjusting the optical distance L using the thickness of the light transmitting layer 22. For example, the thickness of the organic layer 24 may be different for each sub pixel PB, PG, and PR, or the thickness of the pixel electrode 23 may be different for each sub pixel PB, PG, and PR.

Figure 6:
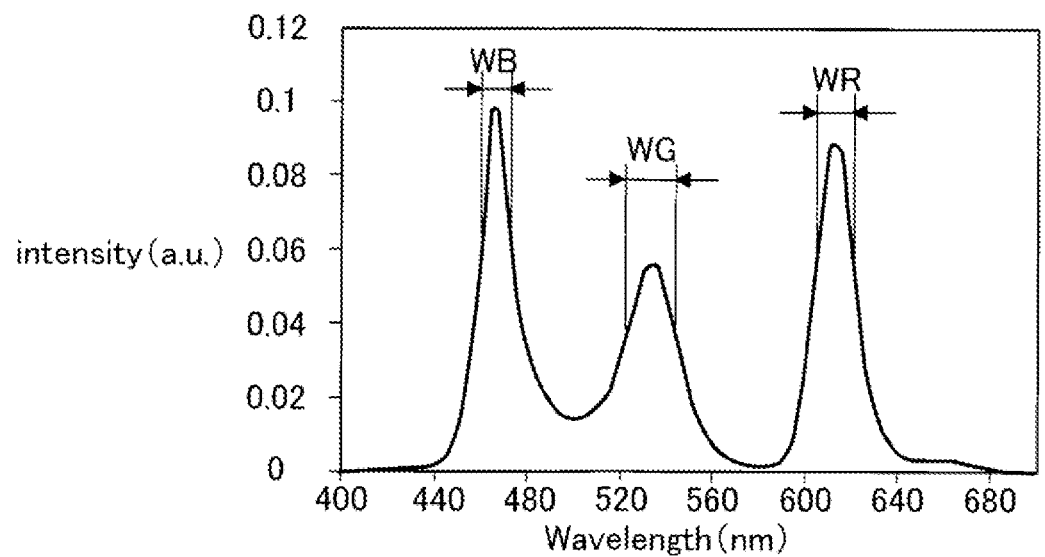
FIG. 6 is a graph illustrating a spectrum of light of a light emitting element having an optical resonance structure.

FIG. 6 is a graph illustrating a spectrum of light from the light emitting element 20 having the optical resonance structure 29. The spectrum of the light illustrated in FIG. 6 is obtained by adding a light emission spectrum of the light emitting element 20R, a light emission spectrum of the light emitting elements 20G1 and 20G2, and a light emission spectrum of the light emitting element 20B together.

Lights emitted from the respective light emitting elements 20 differ from each other in full width at half maximum of a predetermined wavelength region. The full width at half maximum means a width of a wavelength that is 50% of a peak value of the peak wavelength λ0. Among the light emitted from the light emitting element 20R, the light of the red wavelength region corresponding to the optical distance LR has a full width at half maximum WR. Among the light emitted from the light emitting element 20G1, the light of the green wavelength region corresponding to the optical distance LG1 has a full width at half maximum WG. Among the light emitted from the light emitting element 20G2, the light of the green wavelength region corresponding to the optical distance LG2 has a full width at half maximum WG. Among the light emitted from the light emitting element 20B, the light of the blue wavelength region corresponding to the optical distance LB has a full width at half maximum WB. The full width at half maximums WB, WR, and WG are different from each other. To be more specific, the full width at half maximums WB, WR, and WG become smaller in this order. Accordingly, the full width at half maximum WB is the narrowest and the full width at half maximum WG is the widest.

1A-4 Lens Portion 8

Figure 7:
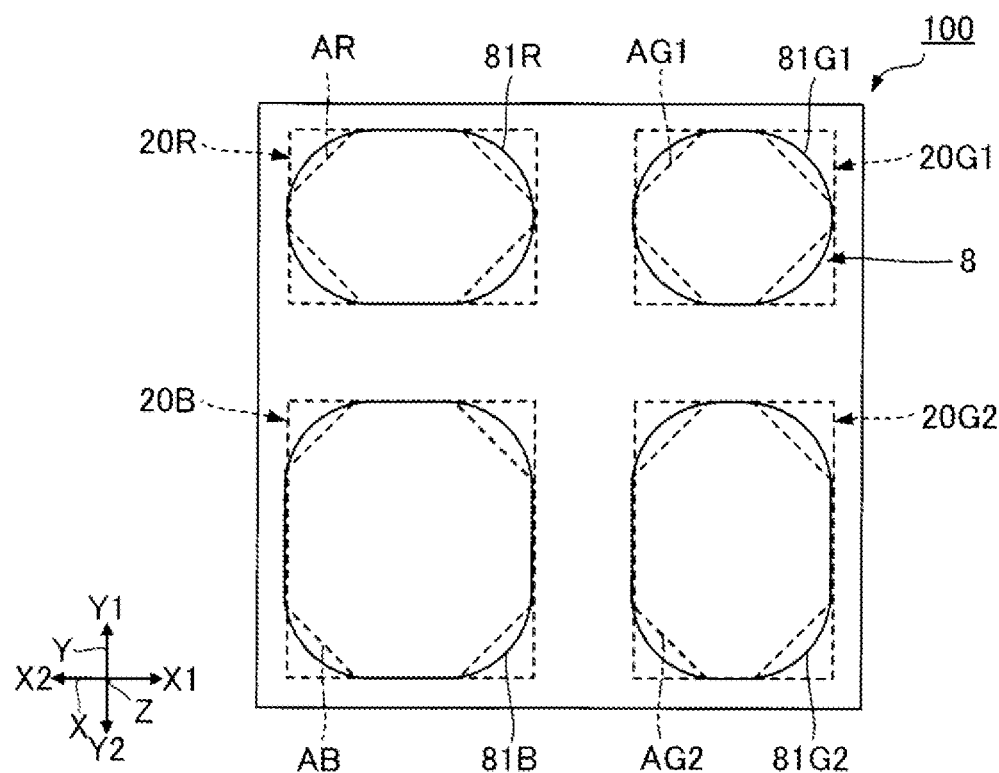
FIG. 7 is a schematic plan view of a lens portion that the electro-optical device illustrated in FIG. 1 has.

FIG. 7 is a schematic plan view of the lens portion 8 that the electro-optical device 100 illustrated in FIG. 1 has. The lens portion 8 illustrated in FIG. 7 has a light transmissivity and an insulating property. The lens portion 8 includes the plurality of microlenses 81. The microlens 81 is provided for each sub pixel P0. To be more specific, the microlens 81 is provided for each light emitting element 20 that the sub pixel P0 includes. Each microlens 81 overlaps with the corresponding light emitting element 20 as viewed in plan view. An area of each microlens as viewed in plan view is larger than the area of the light emitting region A of the light emitting element 20 as viewed in plan view. Accordingly, each microlens 81 is disposed so as to cover the light emitting region A of the light emitting element 20 as viewed in plan view.

Here, although two microlenses 81 are provided in the sub pixel PG, only one microlens 81 may be provided in the sub pixel PG. In this case, the one microlens 81 overlaps with the light emitting elements 20G1 and 20G2 as viewed in plan view.

Figure 8:
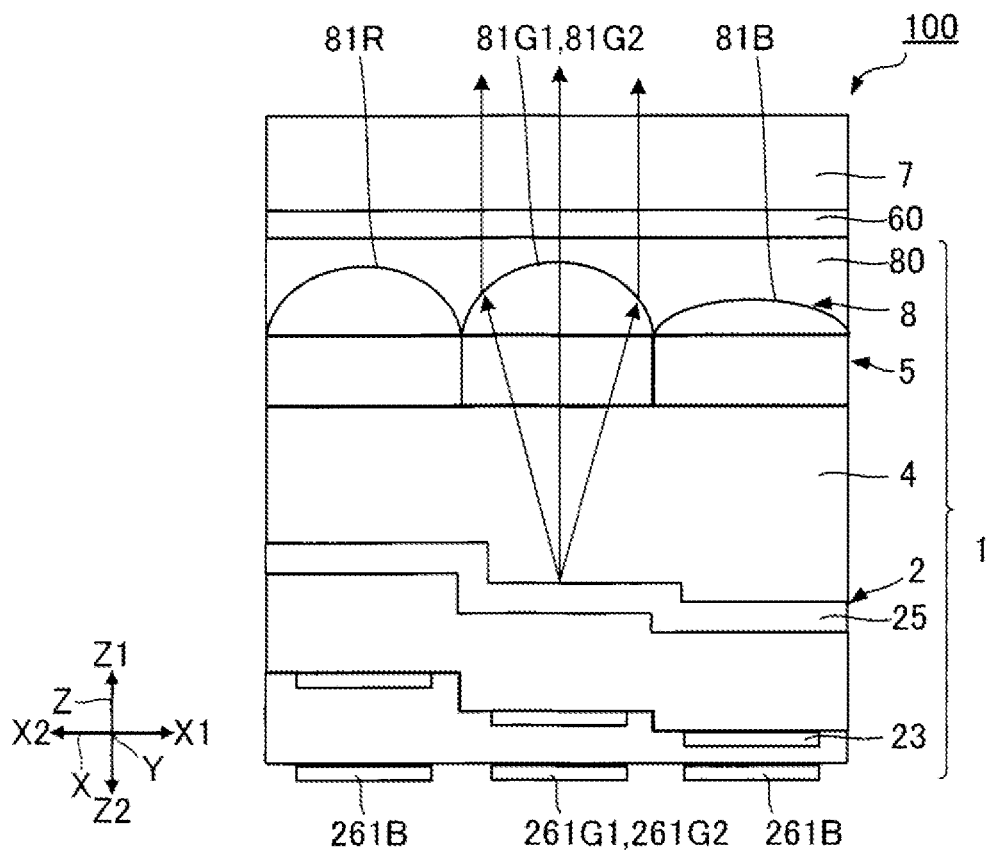
FIG. 8 is a schematic cross-sectional view of the electro-optical device illustrated in FIG. 1.

FIG. 8 is a schematic cross-sectional view of the electro-optical device 100 illustrated in FIG. 1. As illustrated in FIG. 8, each microlens 81 forms a protruding portion that protrudes in the Z1 direction from the color filter 5. Each microlens 81 has a curved surface protruding toward a side opposite to the color filter 5. The curved surface functions as a lens surface for changing a direction of light emitted from the light emitting element 20.

Each microlens 81 allows light emitted from the corresponding light emitting element 20 to pass therethrough. To be more specific, in the present embodiment, as described above, the light emitting element 20 has the optical resonance structure 29. Accordingly, each microlens 81 allows the incidence of light of a wavelength region corresponding to the optical distance L of the light emitting element 20 among the light emitted from the light emitting element 20 corresponding to the microlens 81. To be more specific, among the light emitted from the light emitting element 20R, the light of a red wavelength region corresponding to the optical distance LR is incident on the microlens 81R. Among the light emitted from the light emitting element 20G1, the light of a green wavelength region corresponding to the optical distance LG1 is incident on the microlens 81G1. Among the light emitted from the light emitting element 20G2, the light of a green wavelength region corresponding to the optical distance LG2 is incident on the microlens 81G2. Among the light emitted from the light emitting element 20B, the light of a blue wavelength region corresponding to the optical distance LB is incident on the microlens 81B.

In the present embodiment, the microlens 81B provided in the sub pixel PB is a "first microlens". Either one of the microlens 81R provided in the sub pixel PR or the microlens 81G1 provided in the sub pixel PG is a "second microlens", and the other is a "third microlens". Here, instead of the microlens 81G1, the microlens 81G2 may be the "second microlens" or the "third microlens".

A material for forming the lens portion 8 is different from the material for forming the cover layer 80 described above. It is sufficient for the material for forming the lens portion 8 to have the light transmissivity. However, the material for forming the lens portion 8 is an inorganic material such as a silicon nitride, a silicon oxynitride, or a silicon oxide, or a resin material, for example.

A refractive index of the lens portion 8 is different from the refractive index of the cover layer 80. In the present embodiment, the refractive index of the lens portion 8 is higher than the refractive index of the cover layer 80. Therefore, each microlens 81 functions as a condensing lens for condensing light emitted from the light emitting element 20. Accordingly, light passing through the microlens 81 is refracted so as to be condensed by the lens surface of the microlens 81. By providing the microlens 81, the light emitted in the Z1 direction while being spread from the light emitting element 20 can be condensed. Accordingly, the light extraction efficiency can be enhanced as compared to a case where the microlens 81 is not provided.

A curvature of the microlens 81 is different for each sub pixel P0. Accordingly, the microlenses 81R, 81G1, and 81B are different from each other in curvature. In the present embodiment, the curvature of the microlens 81B, the curvature of the microlens 81R, and the curvature of the microlens 81G1 become smaller in this order. Here, the microlenses 81G1 and 81G2 have the same curvature. The curvature of the microlens 81 is adjusted by a height, a width, and the like of the microlens 81, for example. In the present embodiment, the curvature of the microlens 81 differs for each sub pixel P0 by adjusting the height of the microlens 81.

The curvature of each microlens 81 is optimized corresponding to the full width at half maximum W of the spectrum of the light. As described above, the full width at half maximum WB of the spectrum of the light of the blue wavelength region corresponding to the optical distance LB, among the light emitted from the light emitting element 20B, is different from the full width at half maximum WR of the spectrum of the light of the red wavelength region corresponding to the optical distance LR, among the light emitted from the light emitting element 20R, and the full width at half maximum WG of the spectrum of the light of the green wavelength region corresponding to the optical distance LG, among the light emitted from the light emitting element 20G1 or the light emitting element 20G2. Corresponding to the relationship of these full width at half maximums W, the curvature of the microlens 81B is different from each of the curvature of the microlens 81R and the curvature of the microlens 81G1.

To be more specific, the full width at half maximum WB is smaller than each of the full width at half maximum WR and the full width at half maximum WG. Corresponding to the relationship of these full width at half maximums W, the curvature of the microlens 81B is smaller than each of the curvature of the microlens 81R and the curvature of the microlens 81G1. By optimizing the curvatures of the microlenses 81 corresponding to the relationship of the full width at half maximums W, It is possible to allow each microlens 81 to sufficiently exert its lens function. Accordingly, the light extraction efficiency to the outside of the electro-optical device 100 can be enhanced compared to the related art.

Figure 9:
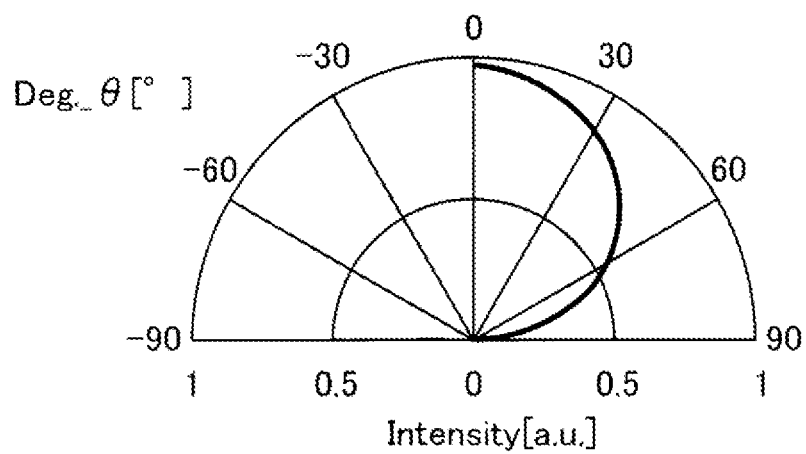
FIG. 9 is a view illustrating a light distribution characteristic of color light having a wide full width at half maximum.
Figure 10:
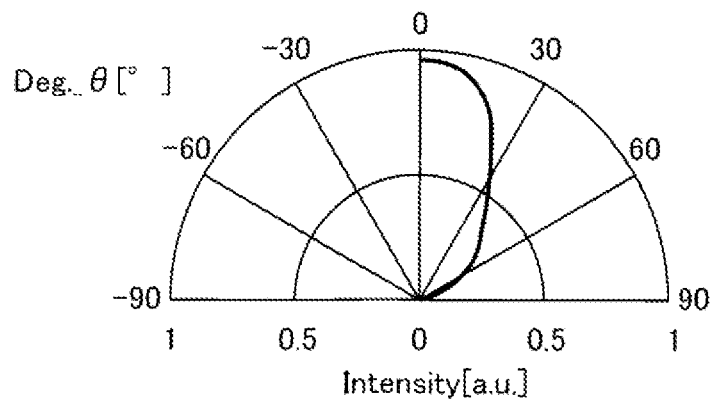
FIG. 10 is a view illustrating a light distribution characteristic of color light having a narrow full width at half maximum.

FIG. 9 is a view illustrating a light distribution characteristic of color light having a wide full width at half maximum W. For example, FIG. 9 illustrates a light distribution characteristic of the light emitted from the light emitting element 20G1. FIG. 10 is a view illustrating a light distribution characteristic of color light having a narrow full width at half maximum W. For example, FIG. 10 illustrates an angle and intensity of the light emitted from the light emitting element 20B. As described above, the full width at half maximum WG of the light corresponding to the optical distance LG1 among the light emitted from the light emitting element 20G1 is wider than the full width at half maximum WB of the light corresponding to the optical distance LB among the light emitted from the light emitting element 20B. Further, when the optical resonance structure 29 is provided, the wider the full width at half maximum. W is, the more the light distribution characteristic is enhanced. The light distribution characteristic is an angular distribution of intensity of light. The more excellent the light distribution characteristic, the wider an angular range where the intensity of light is increased becomes.

The light distribution characteristic of the light emitted from the light emitting element 20G1 illustrated in FIG. 9 is superior to the light distribution characteristic of the light emitted from the light emitting element 20B illustrated in FIG. 10. Accordingly, intensity of light emitted from the light emitting element 20G1 is increased in a wider angular range compared to light emitted from the light emitting element 20B. On the other hand, with respect to light emitted from the light emitting element 20B, light at an angle of 0° or at an angle in an angular range close to the angle 0° exhibits a particularly high intensity. That is, with respect to the light emitted from the light emitting element 20B, intensity of light emitted along a normal direction of the element substrate 1 is particularly high relative to intensity of light emitted toward a direction inclined with respect to the normal direction of the element substrate 1.

Figure 11:
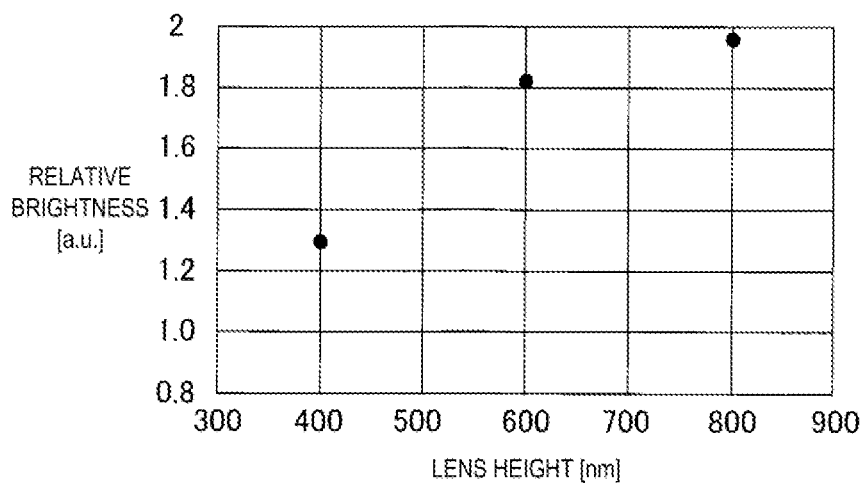
FIG. 11 is a graph illustrating a relationship between a height of a microlens and relative brightness with respect to color light having a wide full width at half maximum.
Figure 12:
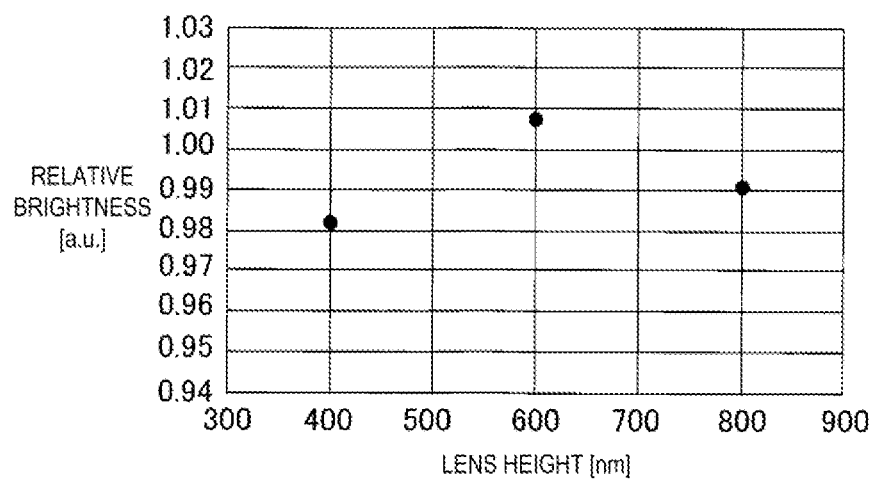
FIG. 12 is a graph illustrating a relationship between a height of a microlens and relative brightness with respect to color light having a narrow full width at half maximum.

FIG. 11 is a graph illustrating a relationship between a height of the microlens 81 and relative brightness with respect to color light having a wide full width at half maximum W. For example, FIG. 11 illustrates a relationship between the height of the microlens 81G1 disposed corresponding to the light emitting element 20G1 and relative brightness. FIG. 12 is a graph illustrating a relationship between the height of the microlens 81 and relative brightness with respect to color light having a narrow full width at half maximum W. For example, FIG. 12 illustrates a relationship between a height of the microlens 81B disposed corresponding to the light emitting element 20B and relative brightness. Further, the relative brightness indicates brightness of light along the normal direction of the element substrate 1 corresponding to a height of the microlens 81 in a state where the microlens 81 is not provided and brightness of the light along the normal direction of the element substrate 1 is set to 1.0. In other words, FIG. 11 illustrates brightness at an angle within a range close to the angle 0° in a state where the microlens 81 is provided using brightness at an angle within a range close to the angle 0° in FIG. 9 as the reference, and FIG. 12 illustrates brightness at an angle within a range close to an angle 0° in a state where the microlens 81 is provided using brightness at an angle within a range close of the angle 0° in FIG. 10 as the reference.

As illustrated in FIG. 11, by providing the microlens 81G1 with respect to the light emitting element 20G1 that emits light having a wide full width at half maximum WG, relative brightness can be increased as compared to a case where the microlens 81G1 is not provided. This is because among the light emitted from the light emitting element 20G1 having an excellent light distribution characteristic, the light directed in a direction inclined with respect to the normal direction of the element substrate 1 is condensed by the lens function of the microlens 81G1.

To the contrary, as illustrated in FIG. 12, even when the microlens 81B is provided for the light emitting element 20B that emits light having a narrow full width at half maximum WB, the lens function is not sufficiently exerted as compared to a case where the microlens 81B is not provided. Further, by increasing the curvature of the microlens 81B, relative brightness in a case where the microlens 81B is provided may be slightly lower than the relative brightness in a case where the microlens 81B is not provided. This is because the light at an angle within a range close to the angle of 0° is refracted by the lens surface of the microlens 81B in a direction different from the normal direction of the element substrate 1 along which the light is originally desired to be extracted. For this reason, it is desirable that the curvature of the microlens 81B be set smaller than the curvature of the microlens 81G1.

As illustrated in FIG. 11 and FIG. 12, by optimizing the curvature of the microlens 81 corresponding to the full width at half maximum W of the light emitted from the light emitting element 20, the extraction efficiency of the light emitted from each light emitting element 20 can be enhanced. To be more specific, as described above, the full width at half maximums WG, WR, and WB become narrower in this order. Accordingly, the full width at half maximum WG is the widest, and the full width at half maximum WB is the narrowest. Therefore, the curvature of the microlens 81B, the curvature of the microlens 81R, and the curvature of the microlens 81G1 become smaller in this order and hence, the extraction efficiency of light of all colors in the electro-optical device 100 can be enhanced. In this manner, by setting the curvature of the microlens 81G1 largest and by setting the curvature of the microlens 81B smallest, it is possible to enhance the light extraction efficiency.

Figure 13:
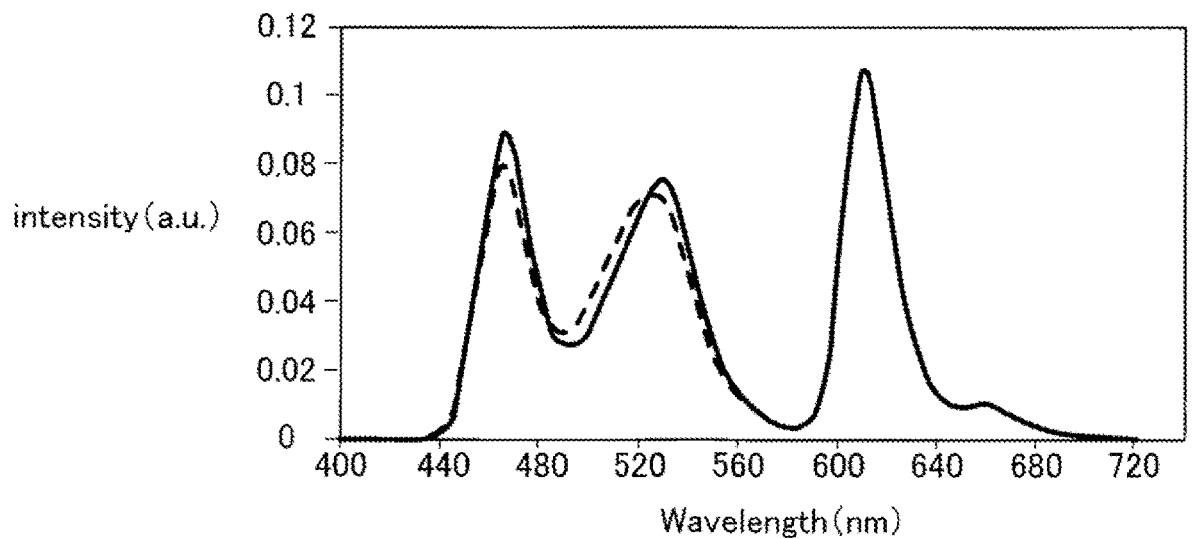
FIG. 13 is a graph illustrating a spectrum of light when a curvature of a microlens is optimized.

FIG. 13 is a graph illustrating a spectrum of light when the curvature of the microlens 81 is optimized. A solid line in FIG. 13 indicates a spectrum of light in a case where the curvature of the microlens 81 is optimized for each color corresponding to the full width at half maximum W. A broken line in FIG. 13 indicates a spectrum of light when only the curvature of the microlens 81R is optimized and the respective curvatures of the microlenses 81G1, 81G2, and 81B are set equal to the curvature of the microlens 81R. That is, the broken line illustrated in FIG. 13 indicates a spectrum of the light in a case where all of the microlenses 81 have the same curvature.

As illustrated in FIG. 13, it is understood that, by optimizing the curvature of the microlens 81 for each color, the intensity of light is increased for each color as compared to a case where all microlenses 81 have the same curvature. In this manner, by optimizing the curvature of the microlens 81 for each color, the light extraction efficiency in the electro-optical device 100 can be enhanced.

1B. Second Embodiment

The second embodiment is described. Here, in the respective examples described hereinafter, with respect to elements each having the same function as the corresponding element in the first embodiment, the same symbols as the symbols used in the description of the first embodiment are used, and the detailed description of the elements is omitted when appropriate.

Figure 14:
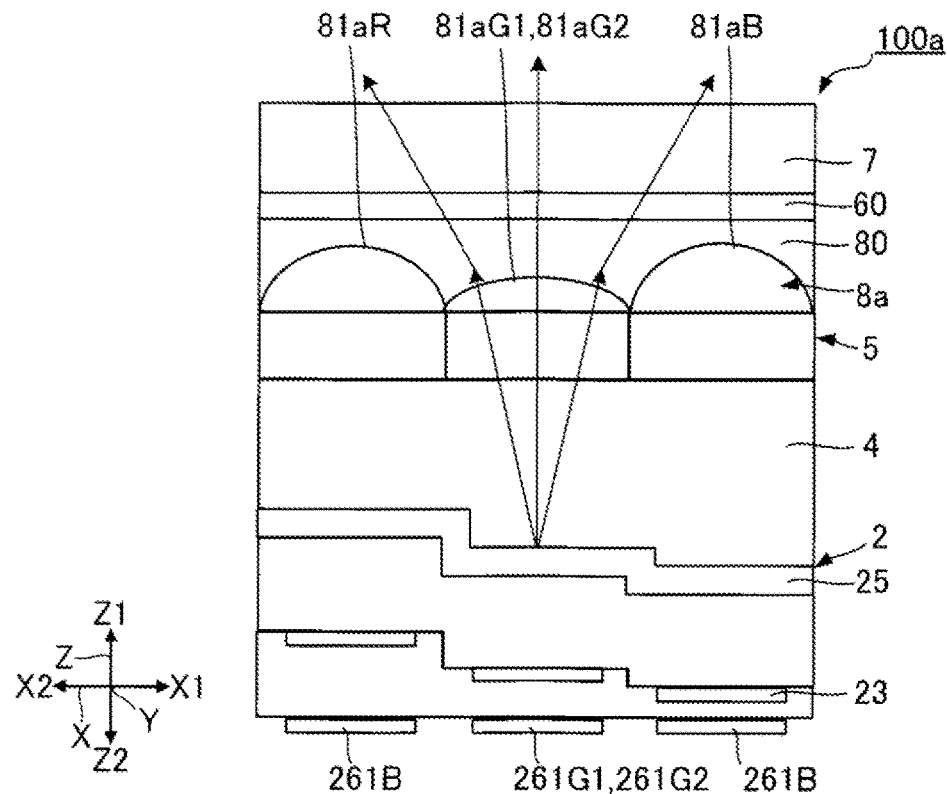
FIG. 14 is a cross-sectional view illustrating an electro-optical device according to a second embodiment.

FIG. 14 is a cross-sectional view illustrating an electro-optical device 100a according to the second embodiment. The electro-optical device 100a according to the present embodiment includes a lens portion 8a instead of the lens portion 8. In the following description with respect to the lens portion 8a, matters which make the lens portion 8a different from the lens portion 8 of the first embodiment are described, and the description of the same matters is omitted when appropriate.

In the present embodiment, light of a green wavelength region is a "first color light". In the present embodiment, either one of light of a red wavelength region or light of a blue wavelength region is a "second color light", and the other is a "third color light". In the present embodiment, each of a light emitting element 20G1 and a light emitting element 20G2 of a sub pixel PG is a "first light emitting element". Either one of a light emitting element 20R of a sub pixel PR or a light emitting element 20B of a sub pixel PB is a "second light emitting element", and the other is a "third light emitting element". In the present embodiment, each of a reflective layer 261G1 and a reflective layer 261G2 is a "first reflective layer". Either one of a reflective layer 261R or a reflective layer 261B is a "second reflective layer", and the other is a "third reflective layer". In the present embodiment, each of the optical distances LG1 and LG2 is a "first optical distance". Either one of an optical distance LR or an optical distance LB is a "second optical distance" and the other is a "third optical distance".

The lens portion 8a illustrated in FIG. 14 includes a plurality of microlenses 81a. In the present embodiment, each of a microlens 81aG1 and a microlens 81aG2 is a "first microlens". Either one of a microlens 81aR or a microlens 81aB is a "second microlens" and the other is a "third microlens".

A refractive index of the lens portion 8a is different from a refractive index of a cover layer 80. In the present embodiment, the refractive index of the lens portion 8a is lower than the refractive index of the cover layer 80. Accordingly, each microlens 81a functions as a divergent lens for diverging the light emitted from the light emitting element 20. Therefore, light passing through the microlens 81a is refracted so as to be diverged at a lens surface of the microlens 81a. By providing the microlens 81a, the light emitted in the Z1 direction while spreading from the light emitting element 20 can be diverged. Accordingly, a visual field angle characteristic can be enhanced compared to a case where the microlens 81a is not provided.

The microlenses 81aG1, 81aR, and 81aB are different from each other in curvature. Here, the microlenses 81aG1 and 81aG2 have the same curvature. The curvature of each microlens 81a is optimized corresponding to the full width at half maximum W of the spectrum of the light. By optimizing the curvatures of the microlenses 81a corresponding to the relationship of the full width at half maximums W, It is possible to allow each microlens 81a to sufficiently exert its lens function.

To be more specific, as described in the first embodiment, the full width at half maximums WB, WR, and WG become wider in this order. In the present embodiment, the curvature of the microlens 81aG1, the curvature of the microlens 81aR, and the curvature of the microlens 81aB become smaller in this order and hence, the visual field angle characteristic of the electro-optical device 100 with respect to all colors can be enhanced. That is, by setting the curvature of the microlens 81aG1 smallest and by setting the curvature of the microlens 81aB largest, it is possible to enhance the visual field angle characteristic with respect to all colors.

In a case where the microlens 81a is a divergent lens, by increasing the curvature of the microlens 81aB with respect to the light emitting element 20B that emits light having a narrow full width at half maximum WB, it is possible to increase a light emission angle close to the normal direction of the element substrate 1. On the other hand, when the curvature of the microlens 81aG1 is increased with respect to the light emitting element 20G1 that emits light having a wide full width at half maximum WG, the light is excessively spread and hence, the light passing through the microlens 81aG1 is totally reflected by an interface between a filler 60 and a transmissive substrate 7, for example.

Accordingly, by optimizing the curvatures of the microlenses 81a for each color, the visual field angle characteristic of the electro-optical device 100a can be enhanced as compared to a case where all microlenses 81a have the same curvature.

2. Electronic Apparatus

2-1. Display Device

Figure 15:
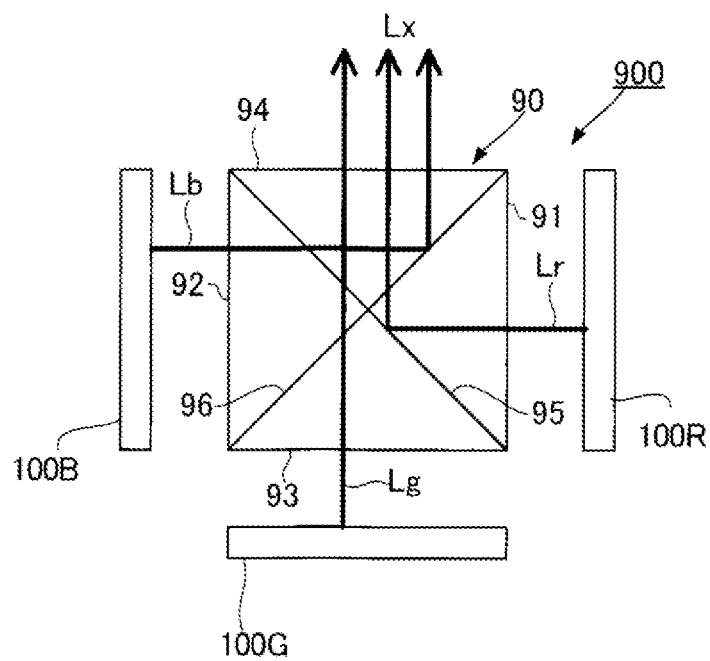
FIG. 15 is a schematic view illustrating a display device as an example of an electronic apparatus.

FIG. 15 is a schematic view illustrating a display device 900 that is an example of the electronic apparatus. The display device 900 illustrated in FIG. 15 includes three panels 100R, 100G, and 100R and a color synthesizing prism 90. The panel 100R is a red panel that emits red light Lr that is light of a red wavelength region. The panel 100G is a green panel that emits green light Lg that is light of a green wavelength region. The panel 100B is a blue panel that emits blue light Lb that is alight of the blue wavelength region.

The color synthesizing prism 90 includes a first incident surface 91, a second incident surface 92, a third incident surface 93, an emission surface 94, a first dichroic mirror 95, and a second dichroic mirror 96. The first incident surface 91 is disposed so as to face the second incident surface 92. The third incident surface 93 is disposed so as to face the emission surface 94. The third incident surface 93 couples the first incident surface 91 and the second incident surface 92 to each other. The emission surface 94 couples the first incident surface 91 and the second incident surface 92 to each other. On the first incident surface 91, the red light Lr emitted from the panel 100R is incident. On the second incident surface 92, the blue light Lb emitted from the panel 100B is incident. On the third incident surface 93, the green light Lg emitted from the panel 100G is incident.

The first dichroic mirror 95 and the second dichroic mirror 96 are arranged such that the first dichroic mirror 95 and the second dichroic mirror 96 intersect each other at an angle 45°. The first dichroic mirror 95 allows light having a wavelength equal to or less than approximately 580 nm to pass therethrough, and reflects light having a wavelength of more than approximately 580 nm. Accordingly, the first dichroic mirror 95 reflects the red light Lr toward the emission surface 94, and allows the blue light Lb and the green light Lg to pass therethrough. The second dichroic mirror 96 allows light having a wavelength equal to or more than approximately 500 nm to pass therethrough, and reflects light having a wavelength of less than approximately 500 nm. Accordingly, the second dichroic mirror 96 reflects the blue light Lb toward the emission surface 94, and allows the red light Lr and the green light Lg to pass therethrough.

The color synthesizing prism 90 emits synthetic light Lx obtained by synthesizing the red light Lr emitted from the panel 100R, the blue light Lb emitted from the panel 100B, and the green light Lg emitted from the panel 100G from the emission surface 94.

1C. Third Embodiment

The third embodiment 3 is described. Here, in the respective examples described hereinafter, with respect to elements each having the same function as the corresponding element in the first embodiment, the same symbols as the symbols used in the description of the first embodiment are used, and the detailed description of the elements is omitted when appropriate.

Figure 16:
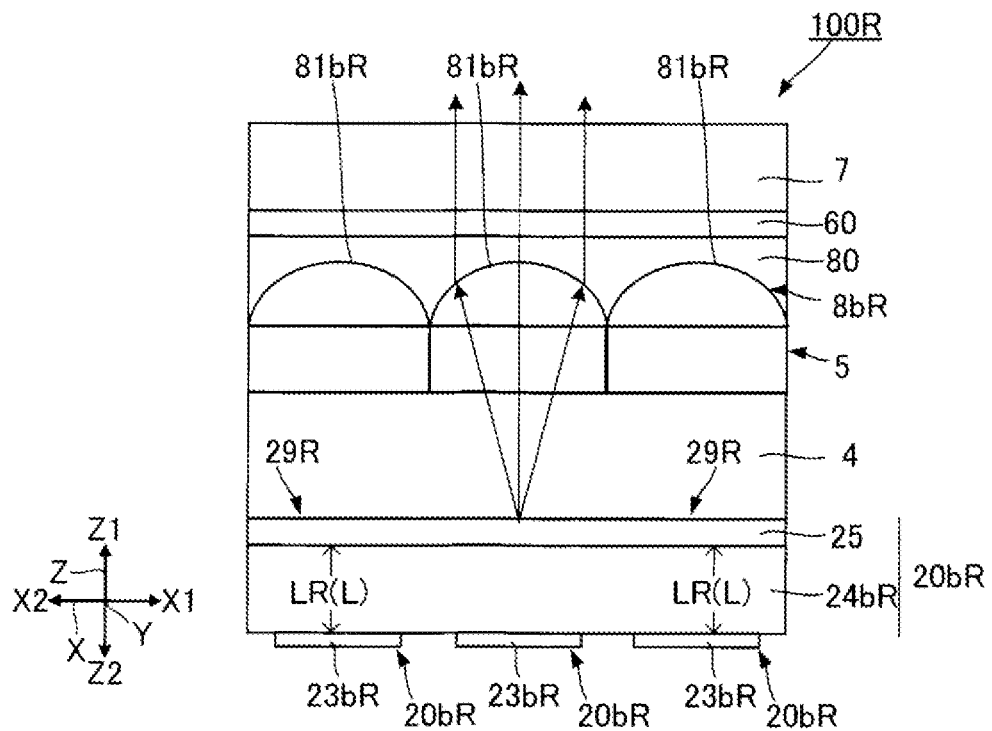
FIG. 16 is a cross-sectional view illustrating a panel for emitting light of a red wavelength region according to a third embodiment.
Figure 17:
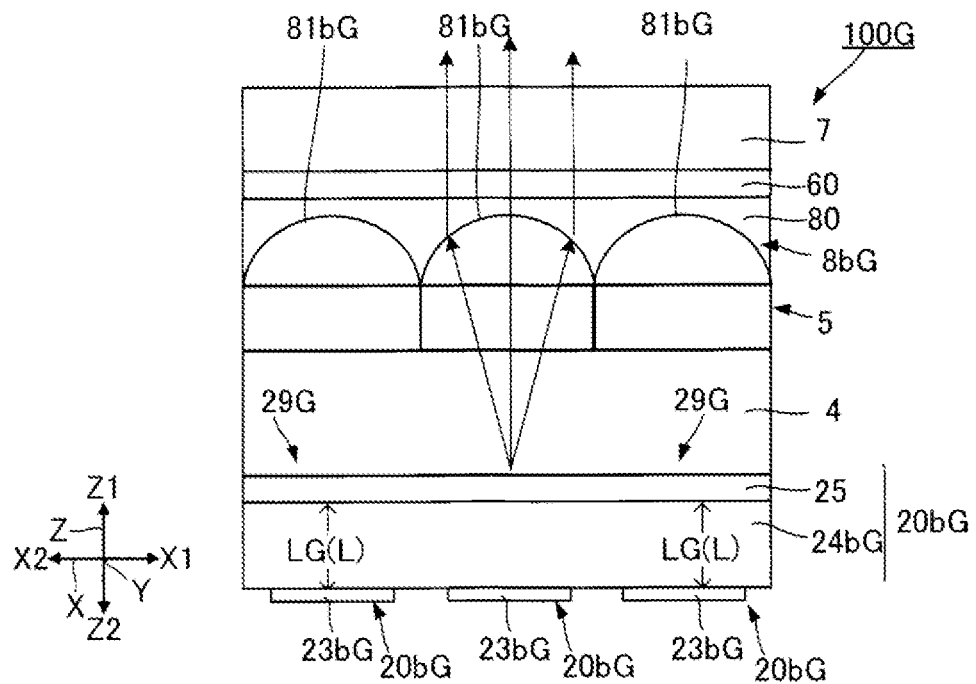
FIG. 17 is a cross-sectional view illustrating a panel for emitting light of a green wavelength region according to the third embodiment.
Figure 18:
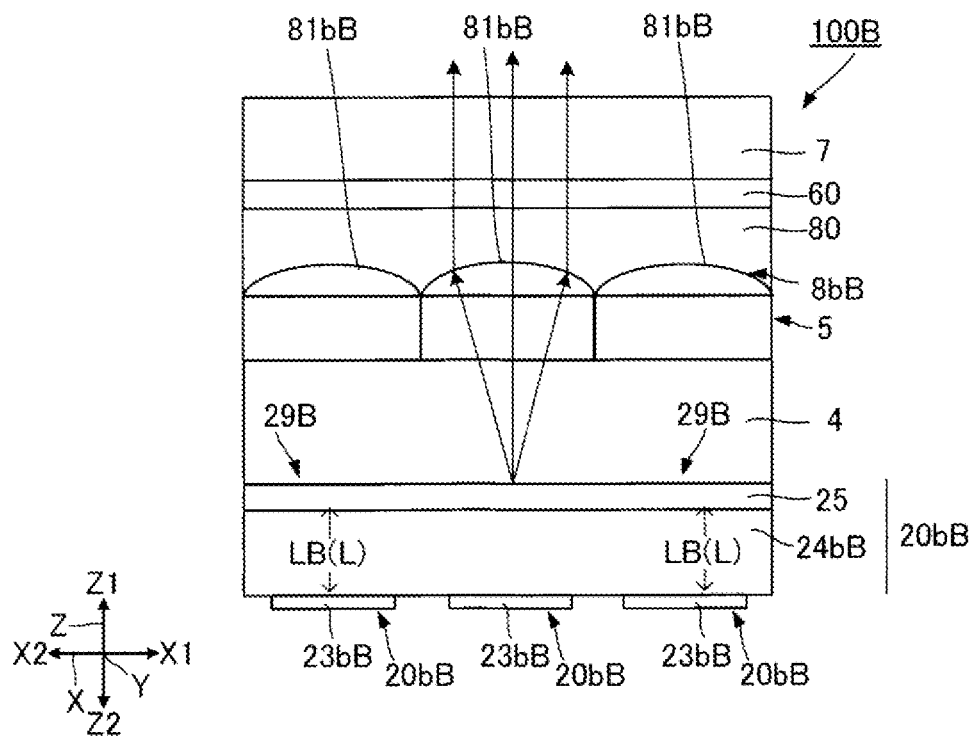
FIG. 18 is a cross-sectional view illustrating a panel for emitting light of a blue wavelength region according to the third embodiment.

FIG. 16 is a cross-sectional view illustrating a panel 100R that emits light of a red wavelength region according to the third embodiment. FIG. 17 is a cross-sectional view illustrating a panel 100G that emits light of a green wavelength region according to the third embodiment. FIG. 18 is a cross-sectional view illustrating a panel 100B that emits light of a blue wavelength region according to the third embodiment. The panel 100R illustrated in FIG. 16, the panel 100G illustrated in FIG. 17, and the panel 100B illustrated in FIG. 18 are used in the display device 900 described above.

The panels 100R, 100G, and 100B of the present embodiment each emit light of a predetermined wavelength region. The panel 100R illustrated in FIG. 16, the panel 100G illustrated in FIG. 17, and the panel 100B illustrated in FIG. 18 each have the same elements as the elements of the electro-optical device 100 of the first embodiment. Hereinafter, with respect to the panels 100R, 100G, and 100B, matters which make the panels 100R, 100G, and 100B different from the electro-optical device 100 of the first embodiment are described, and the description of the same matters is omitted when appropriate.

The panel 100R illustrated in FIG. 16 emits light of the red wavelength region. A plurality of light emitting elements 20bR that the panel 100R has includes a plurality of pixel electrodes 23bR, an organic layer 24bR, and a common electrode 25. The pixel electrode 23bR is provided for each light emitting element 20bR. Accordingly, in the same manner as the first embodiment, the light emitting element 20bR is provided for each sub pixel PR. Further, in the light emitting element 20bR, the reflective portion 26 is omitted. Each pixel electrode 23bR has a reflectivity. Further, the organic layer 24bR includes an organic light emitting material capable of obtaining a red light emission color. The light emitting element 20bR has an optical resonance structure 29R having an optical distance LR.

A lens portion 8bR that the panel 100R has includes a plurality of microlenses 81bR. Each microlens 81bR is provided for each light emitting element 20bR.

The panel 100G illustrated in FIG. 17 emits light of the green wavelength region. A plurality of light emitting elements 20bG that the panel 100G has include a plurality of pixel electrodes 23bG, an organic layer 24bG, and a common electrode 25. Here, the pixel electrode 23bG is provided for each light emitting element 20bG. Accordingly, in the same manner as the first embodiment, the light emitting element 20bG is provided for each sub pixel PG. Further, in the light emitting element 20bG, the reflective portion 26 is omitted. Each pixel electrode 23bG has a reflectivity. Further, the organic layer 24bG includes an organic light emitting material capable of obtaining a green light emission color. The light emitting element 20bG has an optical resonance structure 29G having an optical distance LG.

A lens portion 8bG that the panel 100G has includes a plurality of microlenses 81bG. Each microlens 81bG is provided for each light emitting element 20bG.

The panel 100B illustrated in FIG. 18 emits light of the blue wavelength region. Light emitting elements 20bB that the panel 100B has include a plurality of pixel electrodes 23bB, an organic layer 24bB, and a common electrode 25. Here, the pixel electrode 23bB is provided for each light emitting element 20bB. Accordingly, in the same manner as the first embodiment, the light emitting element 20bB is provided for each sub pixel PB. Further, in the light emitting element 20bB, the reflective portion 26 is omitted. Each pixel electrode 23bB has a reflectivity. Further, the organic layer 24bB includes an organic light emitting material capable of obtaining a blue light emission color. The light emitting element 20bB has an optical resonance structure 29B having an optical distance LB.

A lens portion 8bB that the panel 100B has includes a plurality of microlenses 81bB. Each microlens 81bB is provided for each light emitting element 20bB.

In the present embodiment, the light of the blue wavelength region is "first color light". Either one of the light of the red wavelength region or the light of the green wavelength region is "second color light", and the other is "third color light". In the present embodiment, the panel 100B is a "first panel". Either one of the panel 100R or the panel 100G is a "second panel" and the other is a "third panel". In the present embodiment, the light emitting element 20bB that the panel 100B has is a "first light emitting element". Either one of the light emitting element 20bR that the panel 100R has or the light emitting element 20bG that the panel 100G has is a "second light emitting element", and the other is a "third light emitting element". Further, the common electrode 25 that the panel 100B has is a "first electrode". Either one of the common electrode 25 that the panel 100R has or the common electrode 25 that the panel 100G has is a "second electrode", and the other is a "third electrode". In the present embodiment, the pixel electrode 23bB is a "first reflective layer". Either one of the pixel electrode 23bR or the pixel electrode 23bG is a "second reflective layer", and the other is a "third reflective layer". In the present embodiment, the microlens 81bB is a "first microlens". Either one of the microlens 81bR or the microlens 81bG is a "second microlens" and the other is a "third microlens".

Also in the present embodiment, in the same manner as the first embodiment, a curvature of each microlens 81b is optimized corresponding to a full width at half maximum W of the spectrum of light. As described in the first embodiment, the full width at half maximum WB of the spectrum of light of the blue wavelength region emitted from the light emitting element 20bB is different from the full width at half maximum WR of the spectrum of light of the red wavelength region emitted from the light emitting element 20bR and the full width at half maximum WG of the spectrum of light of the green wavelength region emitted from the light emitting element 20bG. Corresponding to such a configuration, the curvature of the microlens 81bB is different from respective curvatures of the microlens 81bR and the microlens 81bG.

To be more specific, the full width at half maximums WG, WR, and WB become narrower in this order. Accordingly, the full width at half maximum WG is the widest, and the full width at half maximum WB is the narrowest. Therefore, the curvature of the microlens 81bG, the curvature of the microlens 81bR, and the curvature of the microlens 81bB become smaller in this order and hence, the light extraction efficiency of the panels 100R, 100G, and 100B can be enhanced compared to the related art respectively. In this manner, by setting the curvature of the microlens 81bG largest and by setting the curvature of the microlens 81bB small, it is possible to enhance the light extraction efficiency of the panels 100R, 100G, and 100B compared to the related art. Accordingly, the light extraction efficiency of the display device 900 having the panels 100R, 100G, and 100B can be enhanced compared to the related art.

1D. Fourth Embodiment

The fourth embodiment is described. Here, in the respective examples described hereinafter, with respect to elements each having the same function as the corresponding element in the third embodiment, the same symbols used in the description of the third embodiment are used, and the detailed description of the elements is omitted when appropriate.

Figure 19:
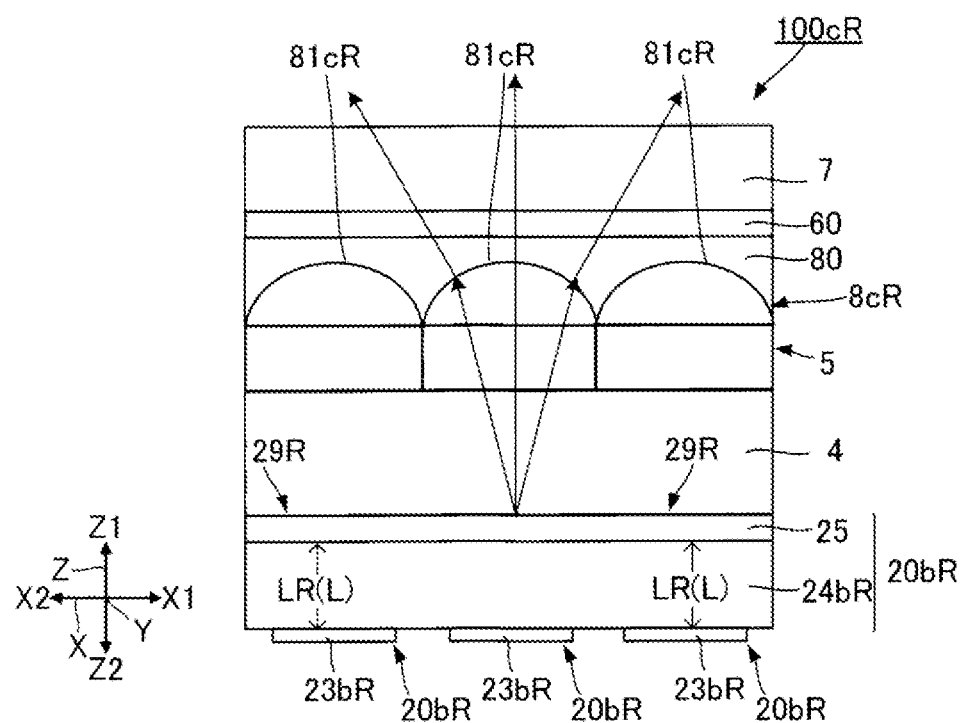
FIG. 19 is a cross-sectional view illustrating a panel for emitting light of a red wavelength region according to a fourth embodiment.
Figure 20:
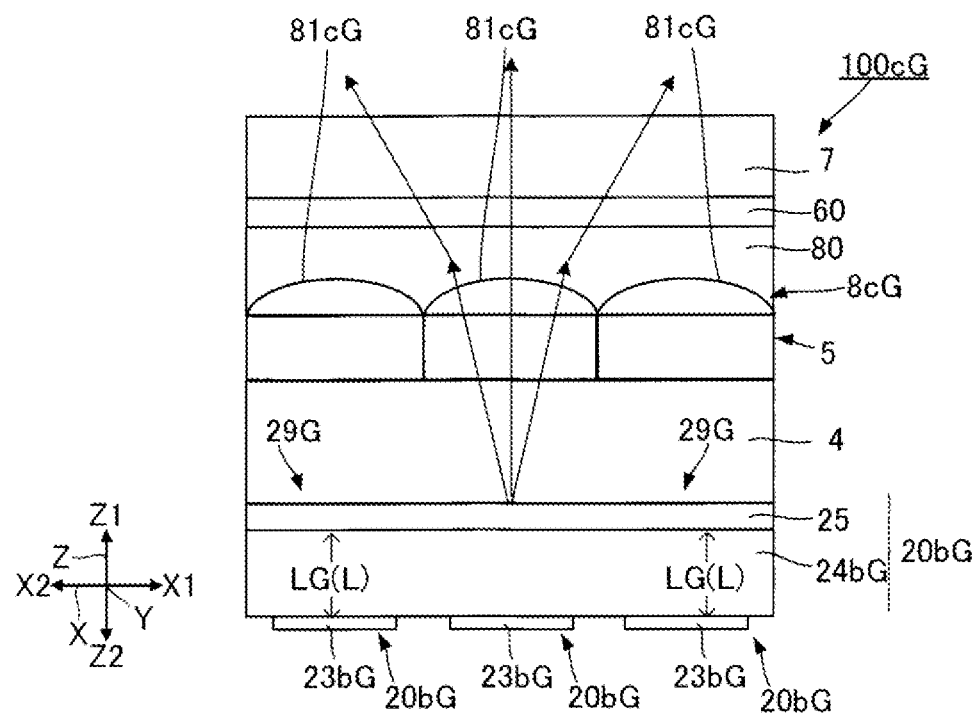
FIG. 20 is a cross-sectional view illustrating a panel for emitting light of a green wavelength region according to the fourth embodiment.
Figure 21:
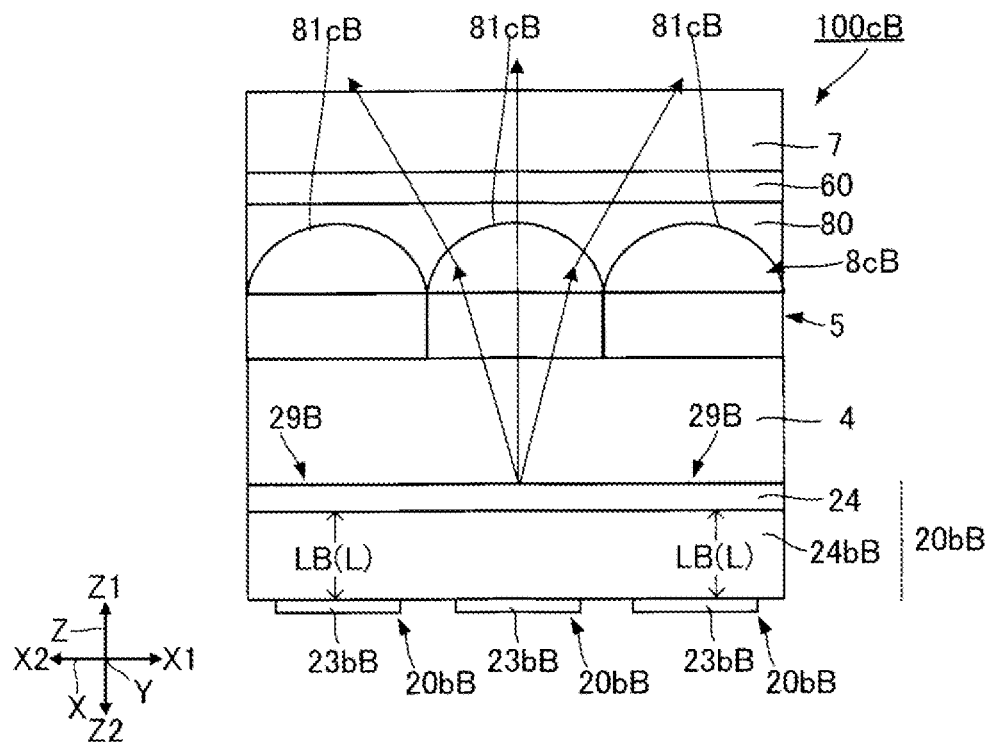
FIG. 21 is a cross-sectional view illustrating a panel for emitting light of a blue wavelength region according to the fourth embodiment.

FIG. 19 is a cross-sectional view illustrating a panel 100cR for emitting light of a red wavelength region according to the fourth embodiment. FIG. 20 is a cross-sectional view illustrating a panel 100cG for emitting light of a green wavelength region according to the fourth embodiment. FIG. 21 is a cross-sectional view illustrating a panel 100cB for emitting light of a blue wavelength region according to the fourth embodiment. The panel 100cR illustrated in FIG. 19, the panel 100cG illustrated in FIG. 20, and the panel 100cB illustrated in FIG. 21 are used in the display device 900 described above.

The panels 100cR, 100cG, and 100cB in the present embodiment each have a lens portion 8c instead of the lens portion 8b of the third embodiment. Hereinafter, with respect to the panels 100cR, 100cG, and 100cB, matters which make the panels 100cR, 100cG, and 100cB different from the panels 100R, 100G, and 100B of the third embodiment are described, and the description of the same matters is omitted when appropriate.

In the present embodiment, light of the green wavelength region is "first color light". Either one of the light of the red wavelength region or the light of the blue wavelength region is "second color light", and the other is "third color light". In the present embodiment, the panel 100G is a "first panel". Either one of the panel 100R or the panel 100G is a "second panel" and the other is a "third panel". Further, in the present embodiment, the light emitting element 20bG that the panel 100cG has is a "first light emitting element". Either one of a light emitting element 20bR that the panel 100cR has or a light emitting element 20bB that the panel 100cB has is a "second light emitting element", and the other is a "third light emitting element". Further, in the present embodiment, a common electrode 25 that the panel 100G has is a "first electrode". Either one of a common electrode 25 that the panel 100R has or a common electrode 25 that the panel 100B has is a "second electrode", and the other is a "third electrode". In the present embodiment, the pixel electrode 23bG that the light emitting element 20bG has is a "first reflective layer". Either one of a pixel electrode 23bR that the light emitting element 20bR has or a pixel electrode 23bB that the light emitting element 20bB has is a "second reflective layer", and the other is a "third reflective layer". In the present embodiment, an optical distance LG is a "first optical distance". Either one of an optical distance LR or an optical distance LB is a "second optical distance" and the other is a "third optical distance".

A lens portion 8cR illustrated in FIG. 19 includes a plurality of microlenses 81cR. A lens portion 8cG illustrated in FIG. 20 includes a plurality of microlenses 81cG. A lens portion 8cB illustrated in FIG. 21 includes a plurality of microlenses 81cB. In the present embodiment, each microlens 81cG is a "first microlens". Either one of the microlens 81cR or the microlens 81cB is a "second microlens", and the other is a "third microlens".

The refractive indexes of the lens portions 8c illustrated in FIG. 19, FIG. 20, and FIG. 21 are different from refractive indexes of cover layers 80 illustrated in FIG. 19. FIG. 20, and FIG. 21 respectively. In the present embodiment, the refractive index of the lens portion 8 is lower than the refractive index of the cover layer 80. Accordingly, each microlens 81c functions as a divergent lens for diverging light emitted from the light emitting element 20. Therefore, light passing through the microlens 81c is refracted so as to be diverged at a lens surface of the microlens 81c. By providing the microlens 81c, light emitted in the Z1 direction while spreading from the light emitting element 20 can be diverged. Accordingly, a visual field angle characteristic can be enhanced compared to a case where the microlens 81c is not provided.

The microlenses 81cR illustrated in FIG. 19, the microlenses 81cG illustrated in FIG. 20, and the microlenses 81cB illustrated in FIG. 21 are different from each other in curvature. The curvature of each microlens 81c is optimized corresponding to a full width at half maximum W of the spectrum of light. By optimizing the curvatures of the microlenses 81c corresponding to the relationship of the full width at half maximums W, it is possible to allow each microlens 81c to sufficiently exert its lens function.

To be more specific, as described in the first embodiment, the full width at half maximums WB, WR, and WG become wider in this order. In the present embodiment, the curvature of the microlens 81cB, the curvature of the microlens 81cR, and the curvature of the microlens 81cG become smaller in this order and hence, a visual field angle characteristic of the display device 900 with respect to all colors can be enhanced. Accordingly, by setting the curvature of the microlens 81cG1 smallest and by setting the curvature of the microlens 81cB largest, it is possible to enhance a visual field angle characteristic with respect to all colors.

In a case where the microlens 81c is a divergent lens, by increasing the curvature of the microlens 81cB with respect to the light emitting element 20bB that emits light having a narrow full width at half maximum WB, it is possible to increase an emission angle of light in a direction close to the normal direction of the element substrate 1. On the other hand, when the curvature of the microlens 81cG1 is increased with respect to the light emitting element 20bG that emits light having a wide full width at half maximum WG, the light is excessively spread and hence, the light passing through the microlens 81cG is totally reflected by an interface between a filler 60 and a transmissive substrate 7, for example.

Accordingly, by optimizing the curvatures of the microlenses 81c for each color, the visual field angle characteristics of the panels 100cR, 100cG, and 100cB can be enhanced as compared to a case where all microlenses 81c have the same curvature. Accordingly, the visual field angle characteristic of the display device 900 having the panels 100cR, 100cG, and 100cB can be enhanced.

1E. Fifth Embodiment

The fifth embodiment is described. Here, in the respective examples described hereinafter, with respect to elements each having the same function as the corresponding element in the third embodiment, the same symbols as the symbols used in the description of the third embodiment are used, and the detailed description of the elements is omitted when appropriate.

Figure 22:
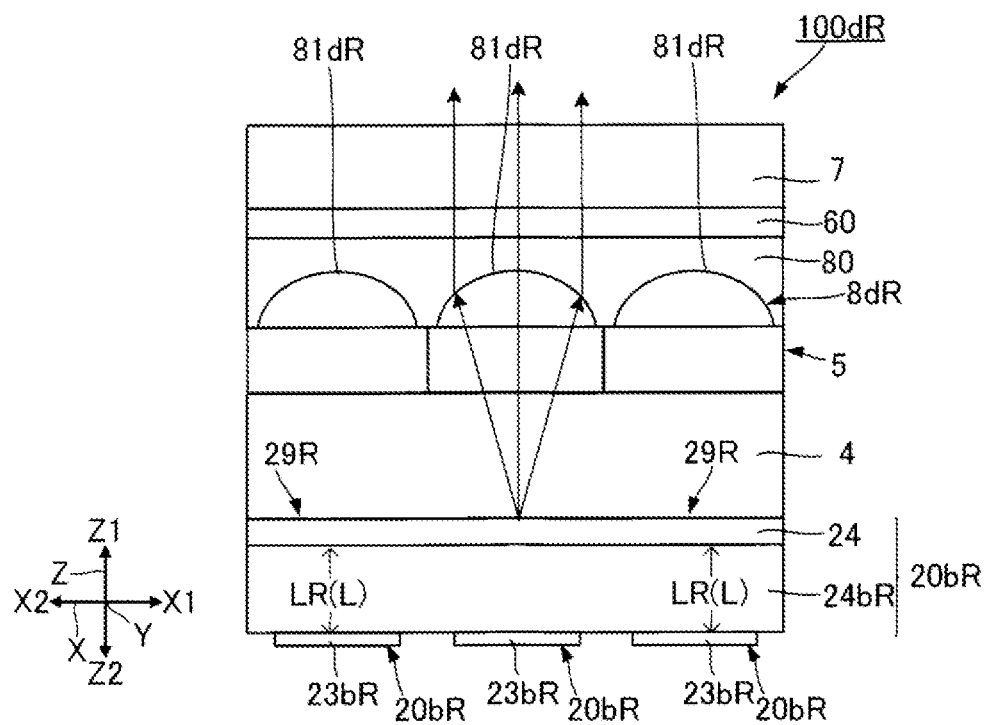
FIG. 22 is a cross-sectional view illustrating a panel for emitting light of a red wavelength region according to a fifth embodiment.
Figure 23:
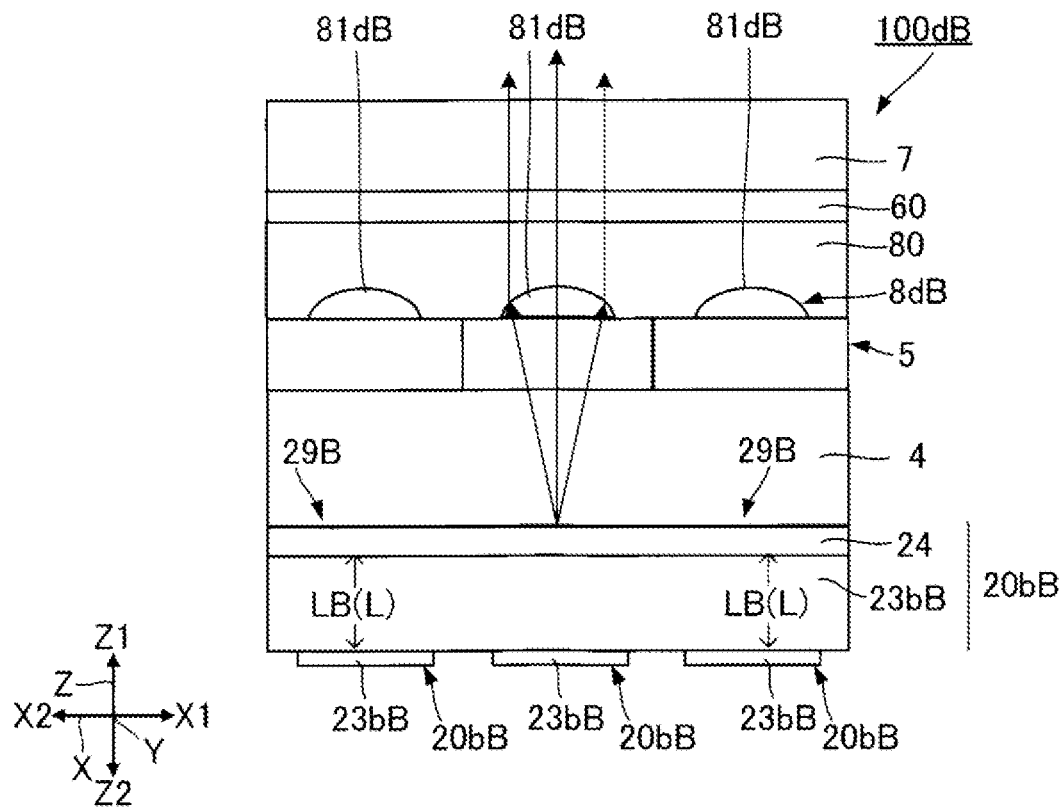
FIG. 23 is a cross-sectional view illustrating a panel for emitting light of a blue wavelength region according to the fifth embodiment.

FIG. 22 is a cross-sectional view illustrating a panel 100dR for emitting light of a red wavelength region according to the fifth embodiment. FIG. 23 is a cross-sectional view illustrating a panel 100dB for emitting light of a blue wavelength region according to the fifth embodiment. The panel 100dR illustrated in FIG. 22, the panel 100G illustrated in FIG. 17, and the panel 100dB illustrated in FIG. 23 are used in the display device 900 described above.

The panel 100dR of the present embodiment has a lens portion 8dR instead of the lens portion 8bR of the third embodiment. The panel 100dB of the present embodiment has a lens portion 8dB instead of the lens portion 8bB of the third embodiment. In the following description with respect to the lens portion 8dR and the lens portion 8dB, matters which make the lens portion 8dR and the lens portion 8dB different from the lens portion 8bR and the lens portion 8bB of the third embodiment are described, and the description of the same matters is omitted when appropriate.

The lens portion 8dR illustrated in FIG. 22 includes a plurality of microlenses 81dR. The lens portion 8dB illustrated in FIG. 23 includes a plurality of microlenses 81dB. Also in the present embodiment, in the same manner as the third embodiment, a curvature of each microlens 81d is optimized corresponding to a full width at half maximum W of the spectrum of light. To be more specific, the full width at half maximums WG, WR, and WB become smaller in this order. Therefore, the curvature of the microlens 81bG illustrated in FIG. 17, the curvature of the microlens 81dR illustrated in FIG. 22, and the curvature of the microlens 81bB illustrated in FIG. 23 become smaller in this order and hence, the light extraction efficiency of the panels 100R, 100G, and 100B can be enhanced compared to the related art respectively. In this manner, by setting the curvature of the microlens 81bG illustrated in FIG. 17 largest and by setting the curvature of the microlens 81dB illustrated in FIG. 23 smallest, it is possible to enhance the light extraction efficiency of the panels 100dR, 100G, and 100dB compared to the related art. Accordingly, the light extraction efficiency of the display device 900 having the panels 100dR, 100G, and 100dB can be enhanced compared to the related art.

An arrangement density of the plurality of microlenses 81dR that the lens portion 8dR illustrated in FIG. 22 includes is smaller than an arrangement density of the plurality of microlenses 81bG illustrated in FIG. 17. Further, an arrangement density of the plurality of microlenses 81dB that the lens portion 8dB illustrated in FIG. 23 includes is smaller than the arrangement density of the plurality of microlenses 81bG illustrated in FIG. 17. Still further, the arrangement density of the plurality of microlenses 81dB illustrated in FIG. 23 is smaller than the arrangement density of the plurality of microlenses 81dR illustrated in FIG. 22. Accordingly, the arrangement density of the plurality of microlenses 81bG illustrated in FIG. 17, the arrangement density of the plurality of microlenses 81dR illustrated in FIG. 22, and the arrangement density of the plurality of microlenses 81dB illustrated in FIG. 23 are different from each other. To be more specific, the arrangement density of the plurality of microlenses 81bG, the arrangement density of the plurality of microlenses 81dR, and the arrangement density of the plurality of microlenses 81dB become smaller in this order. Accordingly, the arrangement density of the plurality of microlenses 81dB is the smallest, and the arrangement density of the plurality of microlenses 81bG is the largest.

The arrangement density is a density of the microlenses 81d or 81b in a display region A10. The smaller a planar area of each microlens 81d is, the smaller the arrangement density of the microlenses 81d becomes.

Figure 24:
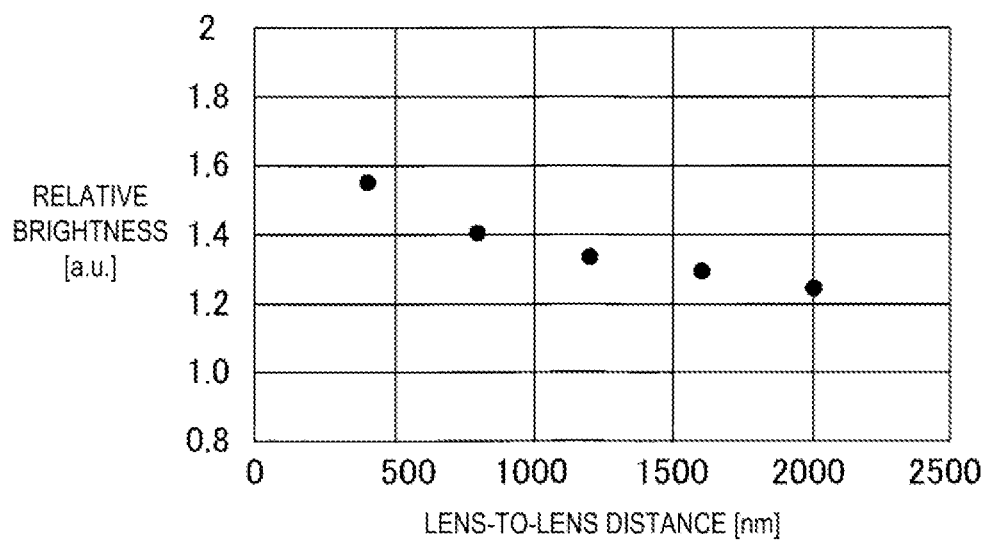
FIG. 24 is a graph illustrating a relationship between a lens-to-lens distance and relative brightness with respect to color light having a wide full width at half maximum.
Figure 25:
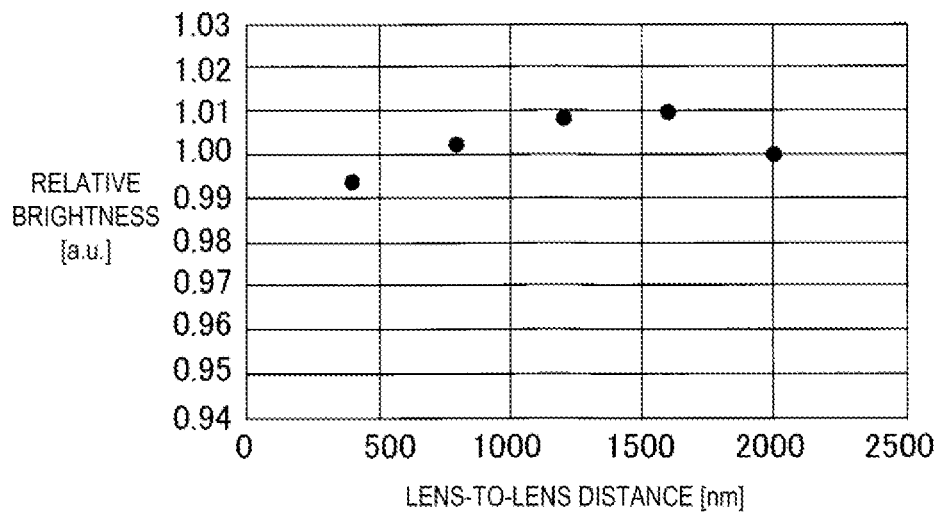
FIG. 25 is a graph illustrating a relationship between a lens-to-lens distance and relative brightness with respect to color light having a narrow full width at half maximum.

FIG. 24 is a graph illustrating a relationship between a lens-to-lens distance and relative brightness with respect to color light having a wide full width at half maximum. For example, FIG. 24 illustrates a relationship between a height of the microlens 81bG and relative brightness with respect to light of a green wavelength region. FIG. 25 is a graph illustrating a relationship between a lens-to-lens distance and relative brightness with respect to color light having a narrow full width at half maximum. For example, FIG. 25 illustrates a relationship between a height of the microlens 81dB and relative brightness with respect to light of a blue wavelength region. The lens-to-lens distance is a distance between two microlenses 81d disposed adjacent to each other. In FIG. 24 and FIG. 25, to facilitate the understanding of an effect brought about by the difference in arrangement density, results are illustrated in a case where the microlens 81bG and the microlens 81dB have the same curvature.

As illustrated in FIG. 24, the smaller the lens-to-lens distance between the microlenses 81bG each provided to the light emitting element 20bG that emits light having a narrow full width at half maximum WG is, the higher the relative brightness becomes. The smaller the lens-to-lens distance is, the more the width of the microlens 81d can be increased. Accordingly, light directed in a direction inclined with respect to the normal direction of the element substrate 1 can be condensed by the lens function of the microlens 81G1.

To the contrary, as illustrated in FIG. 25, even when the microlens 81dB is provided for the light emitting element 20bB that emits light having a narrow full width at half maximum WB, the lens function is not sufficiently exerted as compared to a case where the microlens 81dB is not provided. Further, by decreasing the lens-to-lens distance between the microlenses 81dB, the relative brightness in a case where the microlenses 81dB are provided may be slightly lower than the relative brightness in a case where the microlenses 81dB are not provided. This is because that light at an angle within a range close to an angle of 0° is refracted by a lens surface of the microlens 81dB in a direction different from the normal direction of the element substrate 1 along which the light is originally desired to be extracted. For this reason, it is desirable that the arrangement density of the microlenses 81dB be set smaller than the arrangement density of the microlenses 81bG.

As illustrated in FIG. 24 and FIG. 25, by optimizing the arrangement density of the microlenses 81d corresponding to the full width at half maximum W, the extraction efficiency of light emitted from the light emitting elements 20 can be enhanced. To be more specific, as described above, the full width at half maximums WG, WR, and WB become narrower in this order. Therefore, the arrangement density of the microlenses 81bG, the arrangement density of the microlenses 81dR, and the arrangement density of the microlenses 81dB become smaller in this order and hence, the light extraction efficiency of the panels 100R, 100G, and 100B with respect to all colors of light can be enhanced. In this manner, by setting the arrangement density of the microlenses 81bG largest and by setting the arrangement density of the microlenses 81dB smallest, it is possible to enhance the light extraction efficiency.

Accordingly, it is particularly preferable that the curvature of the microlens 81dB be smaller than the curvature of the microlens 81bG, and the arrangement density of the microlenses 81dB be smaller than the arrangement density of the microlenses 81bG.

When the microlens 81d is a divergent lens, by setting the arrangement density of the microlenses 81bG smallest and by setting the arrangement density of the microlenses 81dB largest, the visual field angle characteristic can be enhanced.

1D. Modifications

The respective embodiments exemplified heretofore can be variously modified. Specific modified specifications applicable to each of the embodiments described above are exemplified hereinafter. Two or more specifications arbitrarily selected from the following exemplifications can be appropriately combined within a range that the specifications do not contradict each other. Further, the following modified specification of the first embodiment may also applicable to the second embodiment, the third embodiment, the fourth embodiment, and the fifth embodiment within a range that the modified specification does not contradict with the respective embodiments.

In the first embodiment, by adjusting the height of the microlens 81, the curvature of the microlens 81 is adjusted. However, for example, the curvature of the microlens 81 may be adjusted by adjusting the refractive index of the microlens 81.

In the first embodiment, although the common electrode 25 is used in common by the plurality of light emitting elements 20, an individual cathode may be provided for each light emitting element 20.

In the first embodiment, although the shape of the light emitting region A is the octagonal shape, the shape of the light emitting region A is not limited to the octagonal shape, and the light emitting region A may have other shapes such as a rectangular shape, a circular shape, or the like. However, since the light emitting region A has the octagonal shape or the circular shape, light can be made to efficiently pass through the end portion of the microlens 81 as compared to a case where the light emitting region A has a rectangular shape. Accordingly, the light extraction efficiency can be further enhanced.

In the respective embodiments, although the light emitting regions are arranged in a rectangle array, the arrangement of the light emitting regions A is not limited to the rectangle array, and the light emitting regions A may be arranged in a Bayer array, a delta array, or a stripe array, for example.

The "electro-optical device" is not limited to the organic EL device, and may be an inorganic EL device using an inorganic material, or may be a μLED device.

Figure 26:
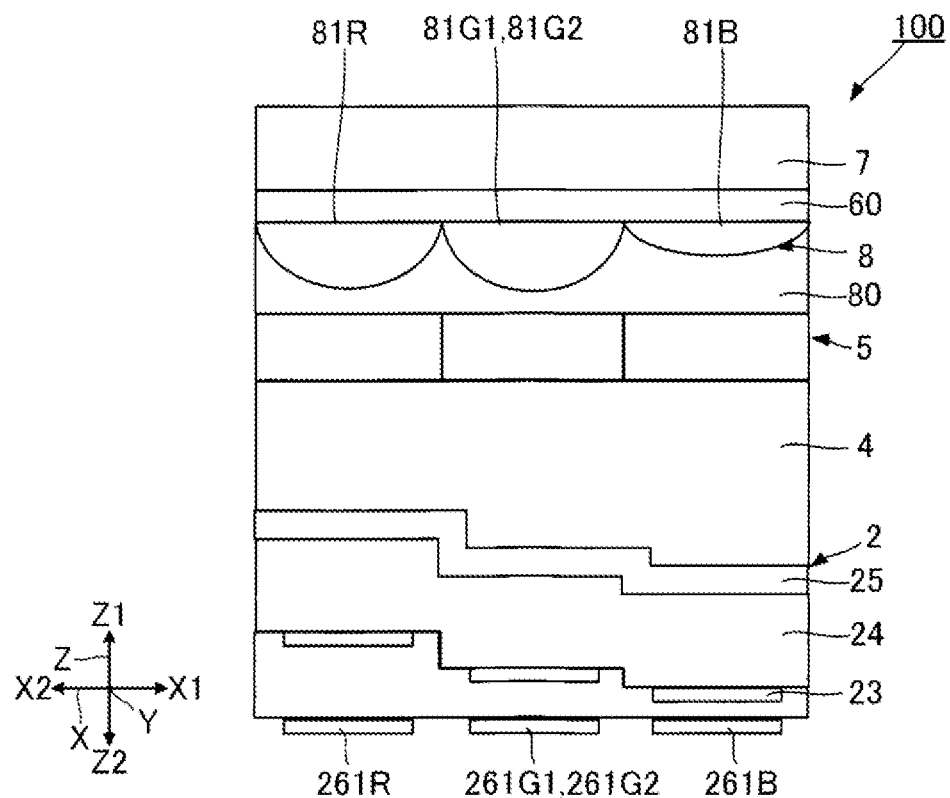
FIG. 26 is a cross-sectional view illustrating an electro-optical device according to a modification.
Figure 27:
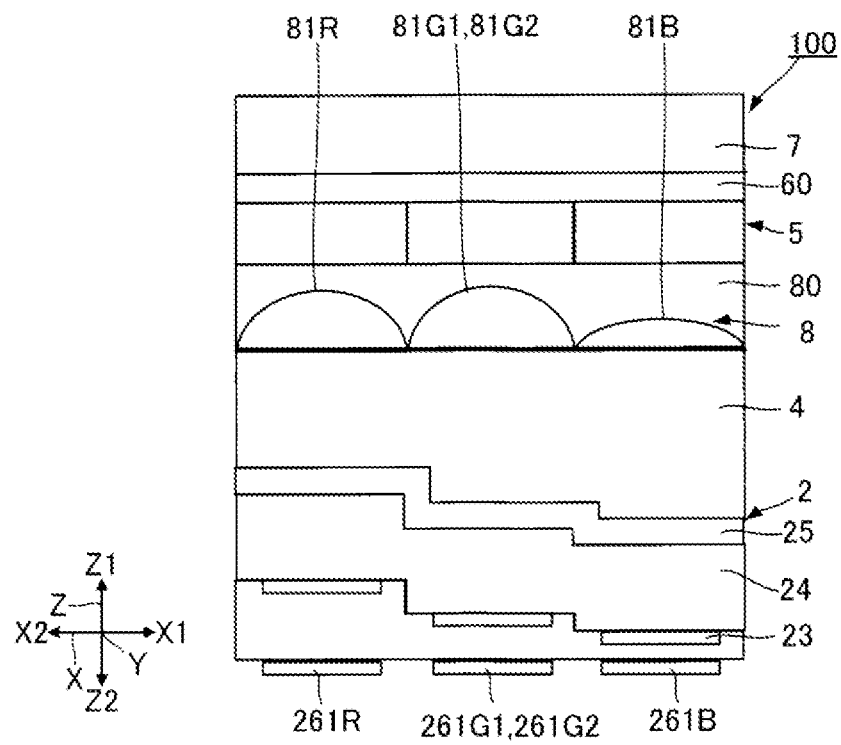
FIG. 27 is a cross-sectional view illustrating an electro-optical device according to another modification.
Figure 28:
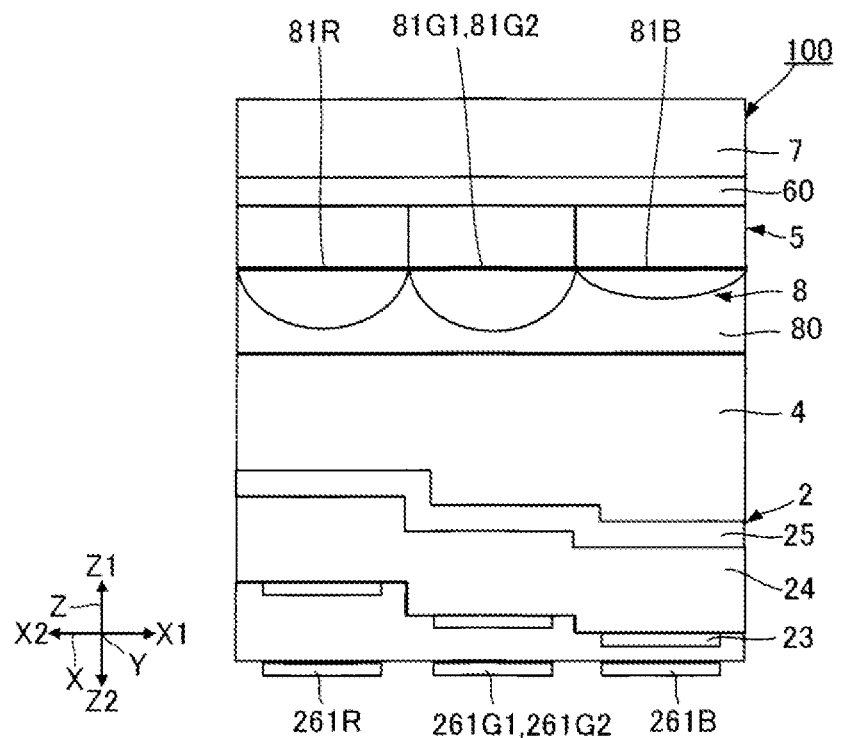
FIG. 28 is a cross-sectional view illustrating an electro-optical device according to still another modification.

In the first embodiment, the lens portion 8 and the cover layer 80 are disposed in this order between the color filter 5 and the transmissive substrate 7. However, the arrangement of the lens portion 8 and the cover layer 80 is not limited to such an arrangement. FIG. 26 is a cross-sectional view illustrating an electro-optical device 100 according to a modification. As illustrated in FIG. 26, a cover layer 80 and a lens portion 8 may be disposed in this order between a color filter 5 and a transmissive substrate 7. FIG. 27 is a cross-sectional view illustrating an electro-optical device 100 according to another modification. As illustrated in FIG. 27, a lens portion 8 and a cover layer 80 may be disposed in this order between a sealing layer 4 and a color filter 5. FIG. 28 is a cross-sectional view illustrating an electro-optical device 100 according to still another modification. As illustrated in FIG. 28, a cover layer 80 and a lens portion 8 may be disposed in this order between a sealing layer 4 and a color filter 5.

Figure 29:
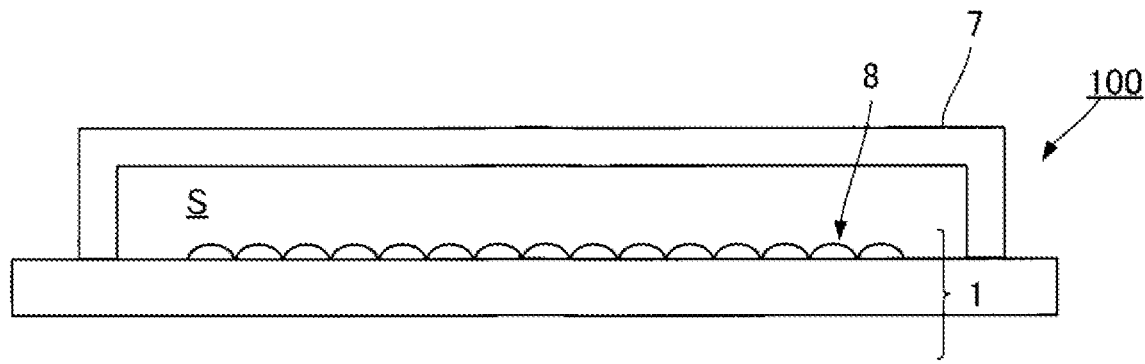
FIG. 29 is a cross-sectional view illustrating an electro-optical device according to further another modification.

In the first embodiment, the cover layer 80 is formed of a resin material, for example. However, instead of the cover layer 80, an air layer may be included. FIG. 29 is a cross-sectional view illustrating an electro-optical device 100 according to further another modification. As illustrated in FIG. 29, a transmissive substrate 7 is disposed in a spaced apart manner from a lens portion 8 and is disposed so as to cover the lens portion 8. A space S between the transmissive substrate 7 and the lens portion 8 is filled with air, for example. The space S functions as an air layer. By providing the air layer instead of providing the cover layer 80, the lens performance of the lens portion 8 can be enhanced.

2. Electronic Apparatus

The electro-optical devices 100 according to the above-described embodiments are applicable to various electronic apparatus.

2-1. Head-Mounted Display

Figure 30:
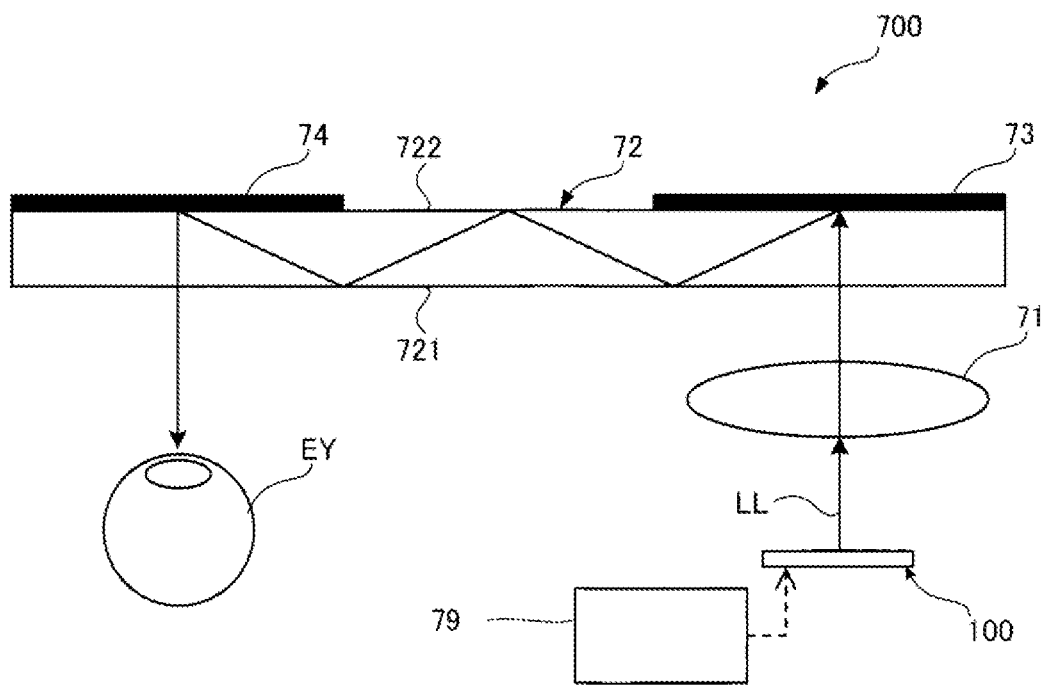
FIG. 30 is a plan view schematically illustrating a part of a virtual image display device as an example of the electronic apparatus.

FIG. 30 is a plan view schematically illustrating a part of a virtual image display device 700 as an example of the electronic apparatus. The virtual image display device 700 illustrated in FIG. 30 is a head-mounted display (HMD) mounted on a head of an observer and is configured to display an image. The virtual image display device 700 includes the electro-optical device 100 described above, a collimator 71, a light guide body 72, a first reflective volume hologram 73, a second reflective volume hologram 74, and a control unit 79. Here, light emitted from the electro-optical device 100 is emitted as video image light LL.

The control unit 79 includes a processor and a memory, for example, and is configured to control an operation of the electro-optical device 100. The collimator 71 is disposed between the electro-optical device 100 and the light guide body 72. The collimator 71 converts lights emitted from the electro-optical device 100 into parallel lights. The collimator 71 is formed of a collimator lens or the like. Lights which are converted into parallel lights by the collimator 71 are incident on the light guide body 72.

The light guide body 72 has a flat plate shape, and is disposed so as to extend in a direction intersecting with a direction of lights incident on the light guide body 72 via the collimator 71. The light guide body 72 reflects the light in the inside thereof and guides the lights. A light incident port on which lights are incident and a light emission port from which lights are emitted are formed in a surface 721 of the light guide body 72 facing the collimator 71. The first reflective volume hologram. 73 serving as a diffractive optical element and the second reflective volume hologram 74 serving as a diffractive optical element are disposed on a surface 722 of the light guide body 72 on a side opposite to the surface 721 of the light guide body 72. The second reflective volume hologram 74 is provided closer to a light emission port side with respect to the first reflective volume hologram 73. The first reflective volume hologram 73 and the second reflective volume hologram 74 each have interference fringes corresponding to a predetermined wavelength region, and diffract and reflect light of the predetermined wavelength region.

In the virtual image display device 700 having such a configuration, video image light LL incident on the light guide body 72 from the light incident port advances while being repeatedly reflected, and is guided to an eye EY of the observer from the light emission port and hence, the observer can observe an image formed of a virtual image formed by the video image light LL.

The virtual image display device 700 includes the above-mentioned electro-optical device 100. The above-mentioned electro-optical device 100 is excellent in light extraction efficiency or visual field angle characteristic, and has a good quality. Accordingly, by providing the electro-optical device 100, it is possible to provide the virtual image display device 700 capable of achieving bright and high-quality display.

Here, the electro-optical device 100a may be used instead of the electro-optical device 100.

2-2. Personal Computer

Figure 31:
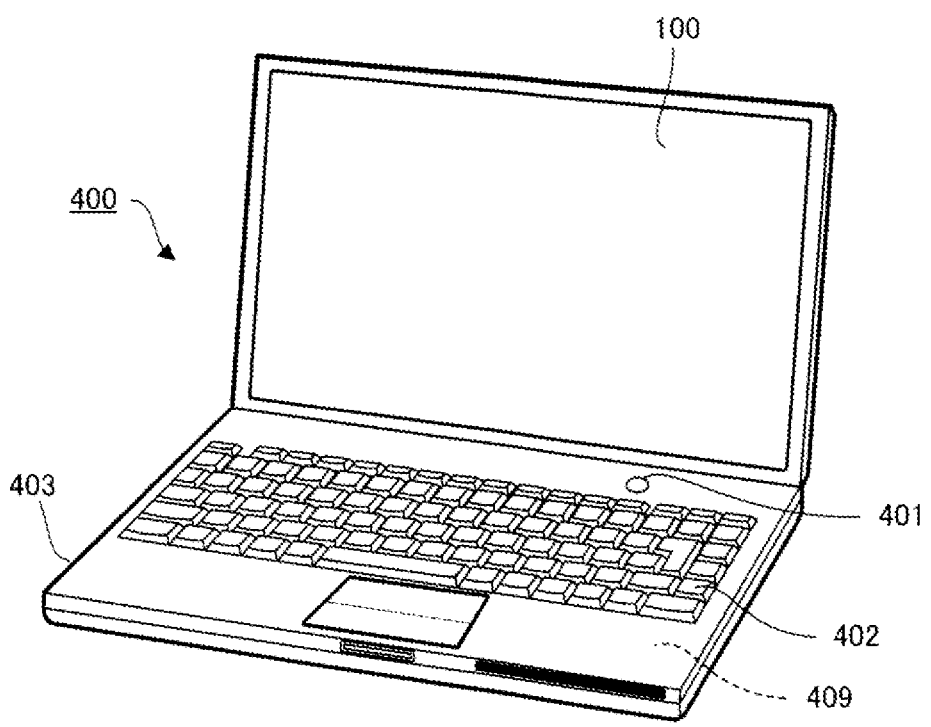
FIG. 31 is a perspective view illustrating a personal computer as an example of the electronic apparatus.

FIG. 31 is a perspective view illustrating a personal computer 400 as an example of the electronic apparatus according to the present disclosure. The personal computer 400 illustrated in FIG. 31 includes an electro-optical device 100, a body portion 403 provided with a power source switch 401 and a keyboard 402, and a control unit 409. The control unit 409 includes a processor and a memory, for example, and is configured to control an operation of the electro-optical device 100. In the personal computer 400, the above-mentioned electro-optical device 100 is excellent in light extraction efficiency or visual field angle characteristic, and has a good quality. Accordingly, by providing the electro-optical device 100, it is possible to provide the personal computer 400 capable of achieving bright and high-quality display. Here, the electro-optical device 100a may be used instead of the electro-optical device 100.

Here, as the "electronic apparatus" including the electro-optical device 100, besides the virtual image display device 700 exemplified in FIG. 30 and the personal computer 400 exemplified in FIG. 31, an apparatus disposed close to eyes of a user such as a digital scope, a digital binocular telescope, a digital still camera, or a video camera can be named. Further, the "electronic apparatus" that includes the electro-optical device 100 is applicable to a mobile phone, a smartphone, a personal digital assistant (PDA), a car navigation device, and a vehicle-mounted display unit. Further, the "electronic apparatus" that includes the electro-optical device 100 is applicable to an illumination for emitting light.

Although the present disclosure has been described heretofore based on the illustrated embodiments, the present disclosure is not limited to these embodiments. Further, the configuration of each component of the present disclosure may be replaced with any configuration that exerts the equivalent functions of the above-described embodiments, and to which arbitrary configuration may be added. Further, the present disclosure may be carried out by adopting the arbitrary configurations of the above-mentioned respective embodiments in combination.

What is claimed is:

1. An electronic apparatus comprising:
   a first panel having: a first light emitting element including a first electrode and a first reflective layer disposed apart from the first electrode by a first optical distance; and a first microlens configured such that light emitted from the first light emitting element is incident on the first microlens;
   a second panel having: a second light emitting element including a second electrode and a second reflective layer disposed apart from the second electrode by a second optical distance; and a second microlens configured such that light emitted from the second light emitting element is incident on the second microlens;
   a third panel having: a third light emitting element including a third electrode and a third reflective layer disposed apart from the third electrode by a third optical distance; and a third microlens configured such that light emitted from the third light emitting element is incident on the third microlens; and
   a color synthesizing prism that synthesizes light emitted from the first panel, the second panel, and the third panel, wherein
   a full width at half maximum of a spectrum of a first color light corresponding to the first optical distance is different from a full width at half maximum of a spectrum of a second color light corresponding to the second optical distance and a full width at half maximum of a spectrum of a third color light corresponding to the third optical distance, and
   a curvature of the first microlens is smaller than a curvature of the second microlens and a curvature of the third microlens.

2. The electronic apparatus according to claim 1, wherein the full width at half maximum of the spectrum of the first color light is narrower than the full width at half maximum of the spectrum of the second color light and the full width at half maximum of the spectrum of the third color light.

3. The electronic apparatus according to claim 1, wherein the full width at half maximum of the spectrum of the first color light is wider than the full width at half maximum of the spectrum of the second color light and the full width at half maximum of the spectrum of the third color light.

4. The electronic apparatus according to claim 2, wherein the first panel is a blue panel.

5. The electronic apparatus according to claim 3, wherein the first panel is a green panel.

* * * * *